(12) United States Patent
Ogawa

(10) Patent No.: US 7,485,913 B2
(45) Date of Patent: Feb. 3, 2009

(54) SEMICONDUCTOR MEMORY DEVICE AND METHOD FOR FABRICATING THE SAME

(75) Inventor: Hisashi Ogawa, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/230,638

(22) Filed: Sep. 21, 2005

(65) Prior Publication Data
US 2006/0163639 A1 Jul. 27, 2006

(30) Foreign Application Priority Data
Jan. 24, 2005 (JP) ............................. 2005-015562

(51) Int. Cl.
*H01L 27/108* (2006.01)
*H01L 29/94* (2006.01)
(52) U.S. Cl. .................. 257/308; 257/296; 257/306; 257/307; 257/310; 257/E27.084; 257/E27.087
(58) Field of Classification Search ............... None
See application file for complete search history.

(56) References Cited
U.S. PATENT DOCUMENTS 5,652,729 A * 7/1997 Iwata et al. ................ 365/222
5,689,126 A * 11/1997 Takaishi .................... 257/306
6,180,448 B1 * 1/2001 Lee ........................... 438/253
6,229,172 B1 * 5/2001 Kobayashi ................. 257/298
6,541,335 B2 * 4/2003 Iwasa ........................ 438/243
2001/0001211 A1 * 5/2001 Tanaka et al. .............. 257/309
2004/0094791 A1 * 5/2004 Ito et al. .................... 257/310
2005/0087789 A1 * 4/2005 Baik et al. .................. 257/307
2005/0116273 A1 * 6/2005 Inoue et al. ................. 257/296
2005/0278592 A1 * 12/2005 Yamada et al. ............. 714/721
2006/0150128 A1 * 7/2006 Zhu et al. ...................... 716/4

FOREIGN PATENT DOCUMENTS

JP 2002-198494 A 7/2002

* cited by examiner

*Primary Examiner*—Andy Huynh
*Assistant Examiner*—Hoang-Quan T Ho
(74) *Attorney, Agent, or Firm*—McDermott Will & Emery LLP

(57) ABSTRACT

A semiconductor memory device includes a memory cell and a dummy cell. The amount of leakage current per unit area in a capacitor in the dummy cell is larger than that in a capacitor in the memory cell.

16 Claims, 28 Drawing Sheets

SEMICONDUCTOR MEMORY DEVICE AND METHOD FOR FABRICATING THE SAME

CROSS-REFERENCES TO RELATED APPLICATIONS

This Non-provisional application claims priority under 35 U.S.C. §119(a) on Patent Application No. 2005-15562 filed in Japan on Jan. 24, 2005, the entire contents of which are incorporated herein by reference.

BACKGROUND OF THE INVENTION

1. Field of the Invention

The present invention relates to semiconductor memory devices and methods for fabricating the same, and more particularly relates to semiconductor memory devices which include stacked capacitors, and methods for fabricating the same.

2. Background Art

Among DRAMs (dynamic random-access memories), which have been downsized continuously, particularly for DRAMs including stacked capacitors, high-dielectric-constant insulating films, made of $Ta_2O_5$, $Al_2O_3$, $HfO_2$ or the like, have been proposed and many of those films have been put into practical use in order to achieve a certain amount of accumulated charge.

However, it has been known that the reliability of these high dielectric constant materials and ferroelectric materials deteriorates due to plasma damage or the like caused when interconnection is formed after formation of capacitors, e.g., when contacts connected to the upper electrodes are formed. To overcome this, several methods for avoiding such plasma damage have also been proposed.

Hereinafter, a ferroelectric memory and a method for fabricating the same, disclosed in Japanese Laid-Open Publication No. 2002-198494, will be described with reference to FIG. 28.

As shown in FIG. 28, a first interlayer dielectric film 112 is formed on a semiconductor substrate 100 having memory cell transistors and doped layers 111 formed therein. In the first interlayer dielectric film 112, first plugs 113, which are connected to the memory cell transistors, and a second plug 114, which is connected to one of the doped layers 111, are provided. Next, capacitor lower electrodes 115, which are connected to the first plugs 113, a capacitor insulating film 118, which is formed of a ferroelectric film, and a capacitor upper electrode 119, which extends beyond the outside of the capacitor insulating film 118 and is electrically connected to the second plug 114, are formed in this order over the first interlayer dielectric film 112. Subsequently, a second interlayer dielectric film 120 is formed over the capacitor upper electrode 119. Then, a third plug 121 for connecting the other doped layer 111 and an upper interconnect 122 is formed through the interlayer dielectric films.

SUMMARY OF THE INVENTION

In the above-described conventional technique, however, when the capacitor insulating film 118 is formed, process steps for selectively removing the capacitor insulating film 118 using a mask are required to be performed so as to establish the electrical connection between the second plug 114 and the capacitor upper electrode 119. This increase in the number of process steps causes problems such as yield decrease, process cost increase, and the like.

In view of the above, it is therefore an object of the present invention to form a semiconductor memory device that includes highly reliable memory cells, without adding any process steps or just by adding a small number of process steps.

In order to achieve the above object, an inventive semiconductor memory device includes: a memory cell and a dummy cell, wherein the amount of leakage current per unit area in a capacitor in the dummy cell is larger than the amount of leakage current per unit area in a capacitor in the memory cell.

Herein, the term "dummy cell" means a dummy memory cell which is formed, e.g., in a peripheral portion of a memory cell array or the like to increase lithography accuracy (patterning accuracy). Unlike conventional "dummy cells" which are not connected to the substrate, the "dummy cells" of the present invention are connected to the substrate so that leakage current is passed through the dummy cells. However, it is apparent that the inventive "dummy cells" are not accessed through the word lines, and thus do not function as memories.

In the inventive device, the transverse dimension of a dummy lower electrode of the capacitor in the dummy cell is preferably shorter than the transverse dimension of a lower electrode of the capacitor in the memory cell.

In the inventive device, the capacitor in the memory cell and the capacitor in the dummy cell are both preferably stacked capacitors; a lower electrode of the capacitor in the memory cell is preferably connected to a memory cell transistor via a first contact plug; a dummy lower electrode of the capacitor in the dummy cell is preferably connected to a dummy cell transistor via a second contact plug; and the bottom of the dummy lower electrode is preferably uneven so that at least part of the bottom of the dummy lower electrode is located lower than the upper surface of the second contact plug.

In the inventive device, the capacitor in the memory cell and the capacitor in the dummy cell are both preferably stacked capacitors; a lower electrode of the capacitor in the memory cell preferably has a hollow cylindrical shape, and only an inner-wall surface of the lower electrode preferably opposes an upper electrode with a capacitive insulating film interposed therebetween; and a dummy lower electrode of the capacitor in the dummy cell preferably has a hollow cylindrical shape, and an inner-wall surface and part of an outer-wall surface of the dummy lower electrode preferably oppose the upper electrode with the capacitive insulating film interposed between the inner wall surface and the upper electrode and between the part of the outer wall surface and the upper electrode.

In the inventive device, a lower electrode of the capacitor in the memory cell is preferably electrically connected to a memory cell transistor; a dummy lower electrode of the capacitor in the dummy cell is preferably electrically connected to a dummy cell transistor; and a first doped layer of the memory cell transistor preferably has a lower dopant concentration than a second doped layer of the dummy cell transistor.

A first inventive method is a method for fabricating a semiconductor memory device including a memory cell and a dummy cell each having a stacked capacitor therein. The inventive method includes the step of simultaneously forming a lower electrode and a dummy lower electrode over a semiconductor substrate on which a memory cell transistor and a dummy cell transistor are formed, the lower electrode being electrically connected to the memory cell transistor, the dummy lower electrode being electrically connected to the dummy cell transistor, wherein the transverse dimension of the dummy lower electrode is shorter than the transverse dimension of the lower electrode.

A second inventive method is a method for fabricating a semiconductor memory device including a memory cell and a dummy cell each having a stacked capacitor therein. The inventive method includes the steps of: forming a memory cell transistor and a dummy cell transistor on a semiconductor substrate; forming a first insulating film on the memory cell transistor and the dummy cell transistor; forming, in the first insulating film, a first contact plug, which is connected to a first doped layer of the memory cell transistor, and a second contact plug, which is connected to a second doped layer of the dummy cell transistor; after the formation of the contact plugs, selectively forming a second insulating film, which serves as an etching stopper, over part of the first insulating film located in a memory cell formation region; forming a third insulating film over the entire surface of the first insulating film as well as over the second insulating film; with a mask pattern being used, etching parts of the third and second insulating films located in the memory cell formation region to form a first recess in which the upper surface of the first contact plug is exposed, and concurrently etching part of the third insulating film located in a dummy cell formation region, and an upper portion of part of the first insulating film located in the dummy cell formation region to form a second recess in which an upper portion of the second contact plug is exposed, the mask pattern having openings corresponding to a lower electrode formation region and a dummy lower electrode formation region; and forming a lower electrode inside the first recess and forming a dummy lower electrode inside the second recess, wherein the bottom of the dummy lower electrode is uneven so that at least part of the bottom of the dummy lower electrode is located lower than the upper surface of the second contact plug.

A third inventive method is a method for fabricating a semiconductor memory device including a memory cell and a dummy cell each having a stacked capacitor therein. The inventive method includes the steps of: forming a memory cell transistor and a dummy cell transistor on a semiconductor substrate; forming a first insulating film on the memory cell transistor and the dummy cell transistor; forming, in the first insulating film, a first contact plug, which is connected to a first doped layer of the memory cell transistor, and a second contact plug, which is connected to a second doped layer of the dummy cell transistor; after the formation of the contact plugs, forming a second insulating film over the first insulating film; etching the second insulating film with a first mask pattern being used, thereby forming, in a memory cell formation region, a first recess in which the upper surface of the first contact plug is exposed, and forming, in a dummy cell formation region, a second recess in which the upper surface of the second contact plug is exposed, the first mask pattern having openings corresponding to a lower electrode formation region and a dummy lower electrode formation region; forming a hollow cylindrical lower electrode inside the first recess and forming a hollow cylindrical dummy lower electrode inside the second recess; and with a second mask pattern being used, etching the second insulating film, thereby exposing at least part of an outer-wall surface of the dummy lower electrode, the second mask pattern having an opening in which the dummy lower electrode and a portion of the second insulating film which is located close to the dummy lower electrode are exposed.

The first to third inventive methods preferably further include the step of forming a gate electrode of the memory cell transistor and a dummy gate electrode of the dummy cell transistor, and then introducing a dopant into the semiconductor substrate with a first mask pattern being used, and introducing a dopant into the semiconductor substrate with a second mask pattern being used, thereby forming a first doped layer of the memory cell transistor and a second doped layer of the dummy cell transistor, the second doped layer having a higher dopant concentration than the first doped layer, the first mask pattern having openings corresponding at least to a memory cell formation region and a dummy cell formation region, the second mask pattern covering at least the memory cell formation region and having an opening corresponding at least to the dummy cell formation region.

In the semiconductor memory devices and the methods for fabricating the same according to the present invention, it is possible to form the dummy cells, in which the amount of leakage current is larger as compared with the memory cells, without adding any process steps or just by adding a small number of process steps. Therefore, even if plasma damage is caused in a process step performed after the formation of the memory cell capacitors, leakage current is passed through the dummy cells to the substrate, thereby enabling charge-up damage in the memory cells to be avoided. It is thus possible to form the semiconductor memory device including the highly reliable memory cells.

As described above, when applied to semiconductor memory devices, the present invention is effective in increasing the reliability of the memory cells, and is thus very useful.

BRIEF DESCRIPTION OF THE DRAWINGS

FIG. 2A is the cross-sectional view taken along the line A-A' of FIG. 1, while FIG. 2B is the cross-sectional view taken along the line B-B' of FIG. 1.

FIG. 10A is the cross-sectional view taken along the line A-A' of FIG. 9, while FIG. 10B is the cross-sectional view taken along the line B-B' of FIG. 9.

FIG. 20A is the cross-sectional view taken along the line A-A' of FIG. 19, while FIG. 20B is the cross-sectional view taken along the line B-B' of FIG. 19.

DETAILED DESCRIPTION OF THE INVENTION

First Embodiment

Hereinafter, a semiconductor memory device and a method for fabricating the same according to a first embodiment of the present invention will be described with reference to the accompanying drawings.

Figure 1:
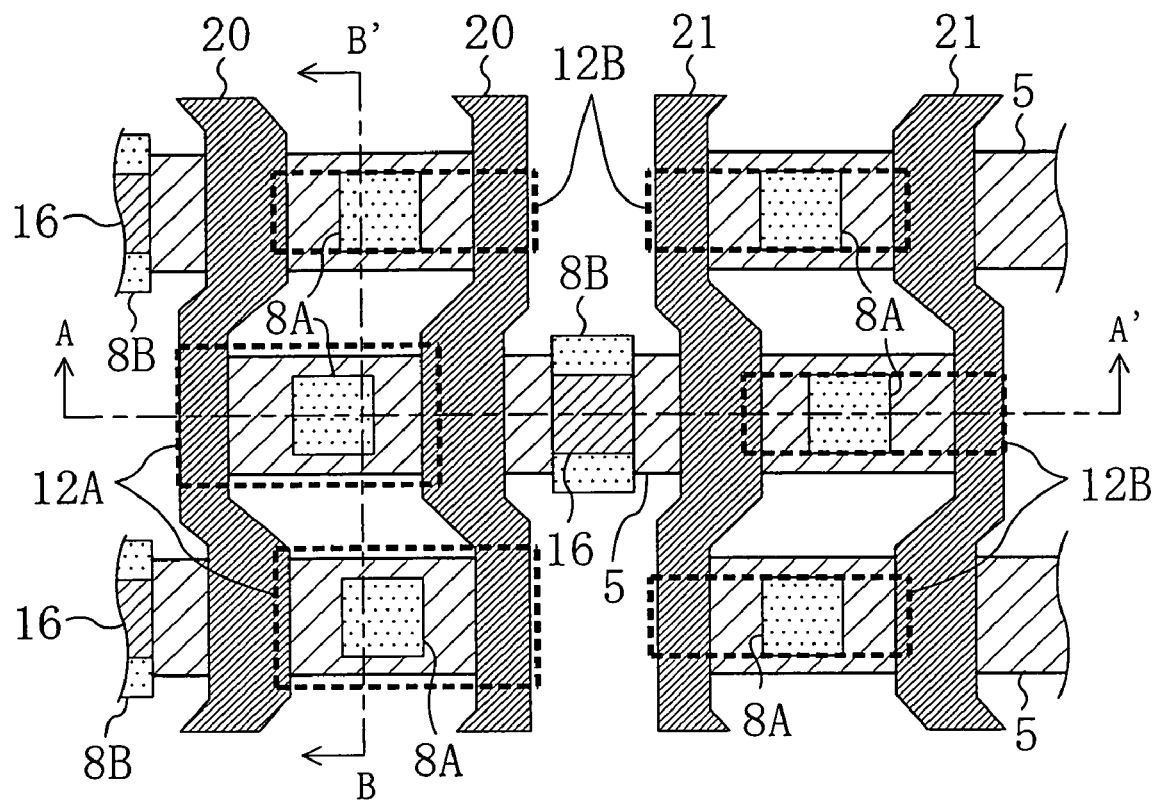
FIG. 1 is a plan view of a semiconductor memory device according to a first embodiment of the present invention.
Figure 2A:
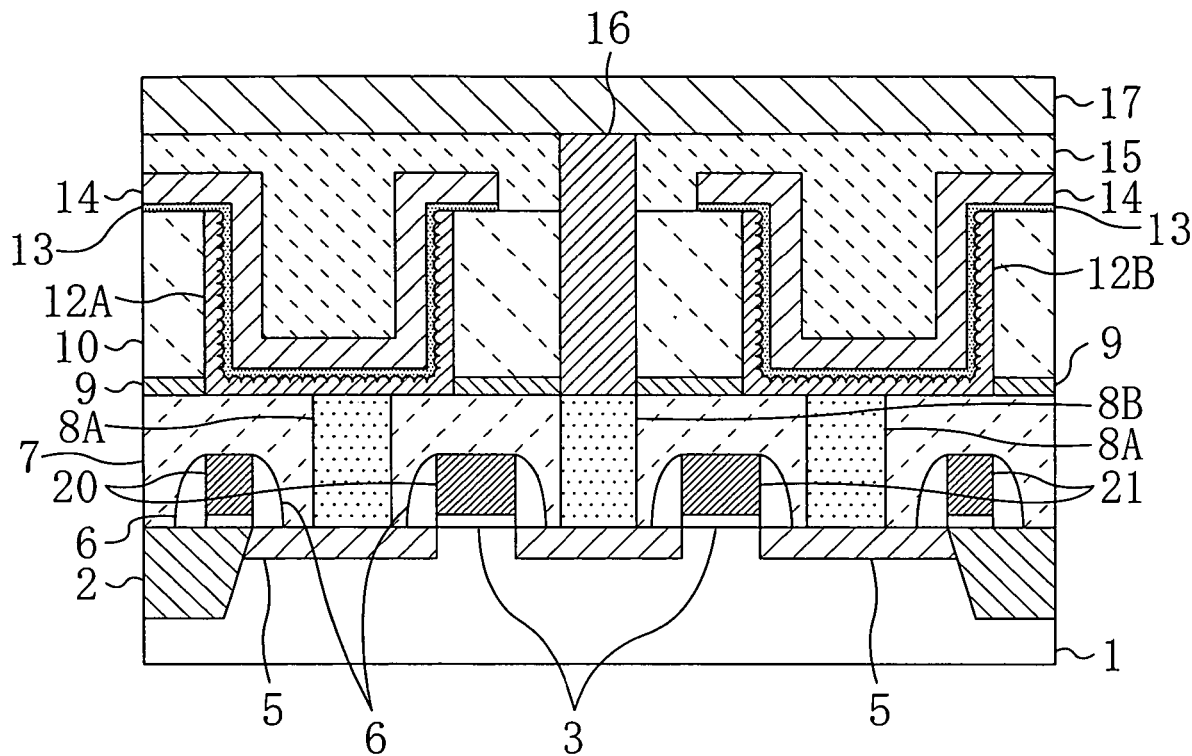
FIGS. 2A and 2B are cross-sectional views of the semiconductor memory device of the first embodiment of the present invention.
Figure 2B:
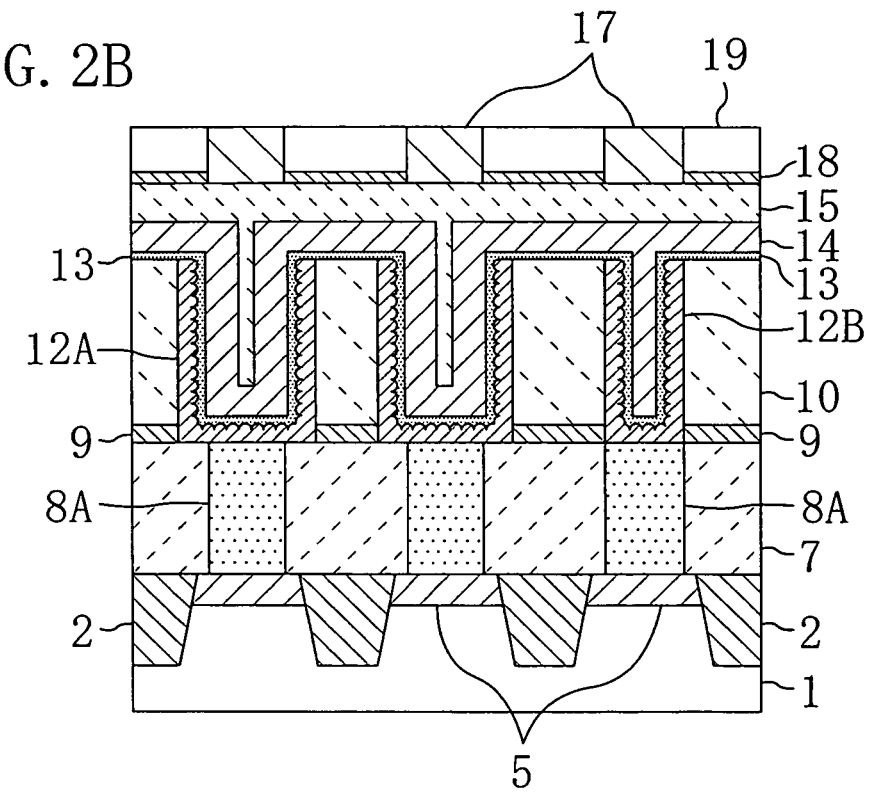

FIG. 1 is a plan view illustrating memory cells in a semiconductor memory device (specifically, a DRAM) according to the first embodiment. FIGS. 2A and 2B are the cross-sectional views taken along the lines A-A' and B-B' of FIG. 1. In FIG. 1, illustration of some components is omitted.

As shown in FIG. 1 and FIGS. 2A and 2B, in a P-type semiconductor substrate 1, for example, N-type doped layers 5, for example, are formed in the surface portions of device regions (that is, memory cell regions and dummy cell regions) surrounded by a device isolation region 2. Herein, a doped layer is a layer which is doped with an impurity. In the memory cell regions, gate electrodes 20, serving as word lines, are formed over the semiconductor substrate 1 with a gate insulating film 3 interposed between the semiconductor substrate 1 and each gate electrode 20. In the dummy cell regions, dummy gate electrodes 21, serving as dummy word lines, are formed over the semiconductor substrate 1 with a gate insulating film 3 interposed between the semiconductor substrate 1 and each dummy gate electrode 21. On the lateral faces of the gate electrodes 20 and dummy gate electrodes 21, insulating sidewalls 6 are formed. A first interlayer dielectric film 7, made of, e.g., a BPSG (boro-phospho silicate glass) film, is formed on the semiconductor substrate 1 as well as on the gate electrodes 20 and the dummy gate electrodes 21. In the first interlayer dielectric film 7, plugs 8A and 8B are formed. The plugs 8A are provided to connect doped layers 5 (that is, the doped layers serving as the source/drain regions of the transistors in the memory cells or in the dummy cells) to lower electrodes 12A in the memory cells or to dummy lower electrodes 12B in the dummy cells. The plug 8B is provided to connect a corresponding doped layer 5 and a bit line. The plugs 8A and 8B are made of polysilicon, for example.

In the memory cell regions and the dummy cell regions, a silicon nitride ($Si_3N_4$) film 9, and a second interlayer dielectric film 10 made of a BPSG film, for example, are formed in this order over the first interlayer dielectric film 7. The portions of the silicon nitride film 9 and second interlayer dielectric film 10 located in regions in which capacitors for the memory cells and capacitors for the dummy cells are to be formed are selectively removed, thereby forming recesses, in which the capacitors for the memory cells and the capacitors for the dummy cells are to be formed. The lower electrodes 12A are formed on the wall and bottom faces of the memory-cell-capacitor formation recesses, while the dummy lower electrodes 12B are formed on the wall and bottom faces of the dummy-cell-capacitor formation recesses. The lower electrodes 12A and the dummy lower electrodes 12B, made of HSG (hemi-spherical grained) polysilicon, for example, are connected to the respective corresponding plugs 8A. Over the lower electrodes 12A and the dummy lower electrodes 12B, a 10-nm-thick $Ta_2O_5$ capacitive insulating film 13, for example, and a 50-nm-hick TiN upper electrode 14, for example, are formed in this order. The lower electrodes 12A, the capacitive insulating film 13, and the upper electrode 14 form the memory cell capacitors, while the dummy lower electrodes 12B, the capacitive insulating film 13, and the upper electrode 14 form the dummy cell capacitors. In other words, each memory cell is formed of the gate electrodes 20, serving as the word lines, and the capacitor composed of the lower electrode 12A, the capacitive insulating film 13, and the upper electrode 14, while each dummy cell is formed of the dummy gate electrodes 21, serving as the dummy word lines, and the capacitor composed of the dummy lower electrode 12B, the capacitive insulating film 13, and the upper electrode 14.

A third interlayer dielectric film 15, made of a NSG (non-doped silicate glass) film, for example, is formed on the second interlayer dielectric film 10 as well as on the upper electrode 14. The surface of the third interlayer dielectric film 15 is planarized. A bit line contact 16, which is connected to the plug 8B, is formed through the silicon nitride film 9, the second interlayer dielectric film 10, and the third interlayer dielectric film 15. Although not shown, a contact that is connected to the upper electrode 14 is also formed in the third interlayer dielectric film 15.

A silicon nitride film 18, and a fourth interlayer dielectric film 19 made of a BPSG film, for example, are formed in this order over the third interlayer dielectric film 15. In the silicon nitride film 18 and the fourth interlayer dielectric film 19, bit lines (wires) 17, which are connected to the bit line contacts 16, are formed.

As shown in FIG. 1, a feature of this embodiment is the layout of the lower electrodes 12A and the dummy lower electrodes 12B. Specifically, when viewed from above, each lower electrode 12A and each dummy lower electrode 12B are rectangular in shape, and the transverse dimension (i.e., the dimension of the shorter sides) of the rectangle of each dummy lower electrode 12B is shorter than the transverse dimension of the rectangle of each lower electrode 12A.

Figure 3:
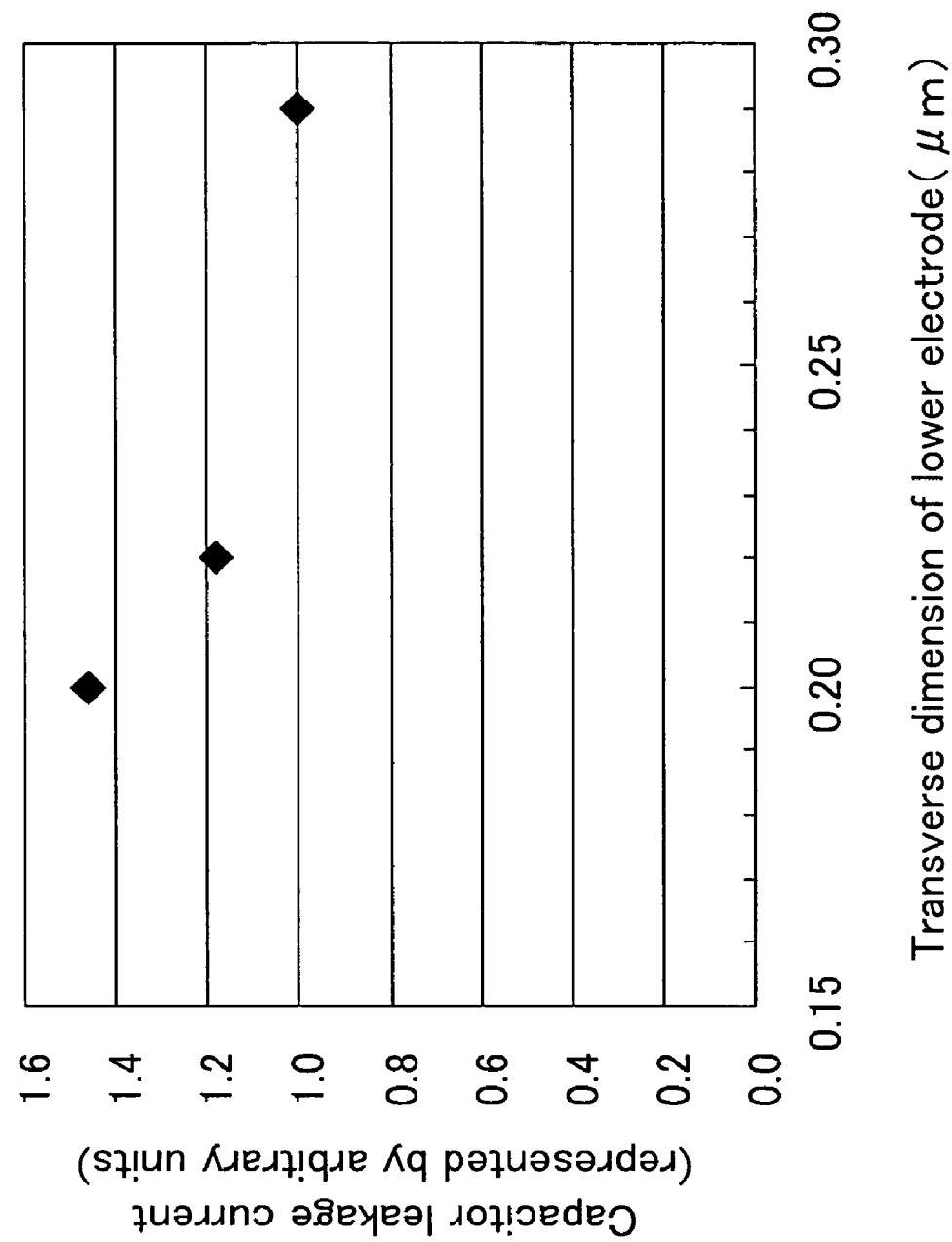
FIG. 3 indicates the results of a study by the present inventor on the relations between the transverse dimension of a lower electrode and the amount of leakage current caused in the capacitor.

The present inventor examined the relations between the transverse dimension of a lower electrode and the amount of leakage current caused in the capacitor (more accurately, the amount of leakage current caused per unit area of the lower electrode), and FIG. 3 indicates the results of the examination. In FIG. 3, the horizontal axis represents the transverse dimension of the lower electrode, while the vertical axis indicates the amount of leakage current caused in the capacitor. As a standard for the amount of leakage current indicated by the vertical axis, the amount of leakage current produced when the transverse dimension of the lower electrode is 0.29 μm is set at 1.0.

As shown in FIG. 3, as the transverse dimension of the lower electrode is decreased, the amount of leakage current caused in the capacitor increases. This is presumably because as the transverse dimension of the lower electrode is reduced, the capacitive insulating film deteriorates in quality due to stress and the like, and thus becomes more conductive.

As described above, in the semiconductor memory device of this embodiment, since the layout of the lower electrodes and dummy lower electrodes is such that the transverse dimension of each dummy lower electrode 12B is shorter than the transverse dimension of each lower electrode 12A, the amount of leakage current produced per unit area of each dummy cell capacitor is larger than that produced per unit area of each memory cell capacitor. In other words, the leakage current is likely to flow through the dummy cell capacitors. Therefore, even if plasma damage is caused in a process step performed after the formation of the memory cell capacitors, the electric charge (leakage current) produced by the plasma damage passes preferentially through the dummy cell capacitors. It is thus possible to avoid charge-up damage in the capacitive insulating film 13 in the memory cells.

Next, it will be described how to fabricate the semiconductor memory device of the first embodiment with reference to the accompanying figures.

FIGS. 4A, 4B, 5A, 5B, 6A, 6B, 7A, 7B, 8A, and 8B are cross-sectional views indicating process steps for fabricating the semiconductor memory device of the first embodiment. FIGS. 4A, 5A, 6A, 7A, and 8A correspond to the cross-sectional structure taken along the line A-A' of FIG. 1, while FIGS. 4B, 5B, 6B, 7B, and 8B correspond to the cross-sectional structure taken along the line B-B' of FIG. 1.

Figure 4A:
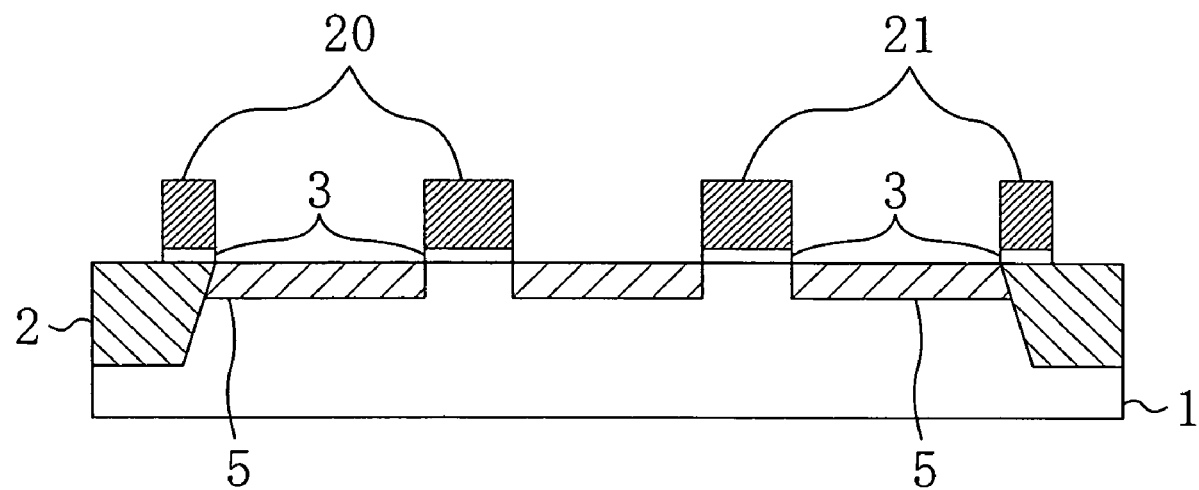
FIGS. 4A and 4B are cross-sectional views indicating process steps for fabricating the semiconductor memory device of the first embodiment of the present invention.
Figure 4B:
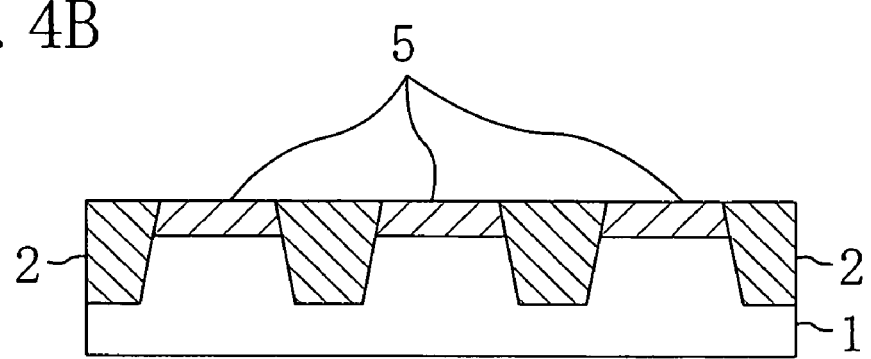

First, as shown in FIGS. 4A and 4B, a device isolation region 2 is formed in a P-type semiconductor substrate 1, for example. Then, although not shown, well implant, channel-stop implant, and dopant (impurity) implant for threshold-value control are carried out in sequence so as to form N-channel transistors and P-channel transistors in a logic section and memory cell transistors. Thereafter, gate electrodes 20, serving as word lines, and dummy gate electrodes 21, serving as dummy word lines, are formed in memory cell regions and dummy cell regions, respectively, over the semiconductor substrate 1 with a gate insulating film 3 interposed between the semiconductor substrate 1 and each electrode. Subsequently, in the memory cell regions and the dummy cell regions, P (phosphorus) ions, for example, are implanted into the semiconductor substrate 1, thereby forming N-type doped layers 5. Although not shown, so-called LDD (lightly doped drain) implant or extension implant is performed in the logic section.

Figure 5A:
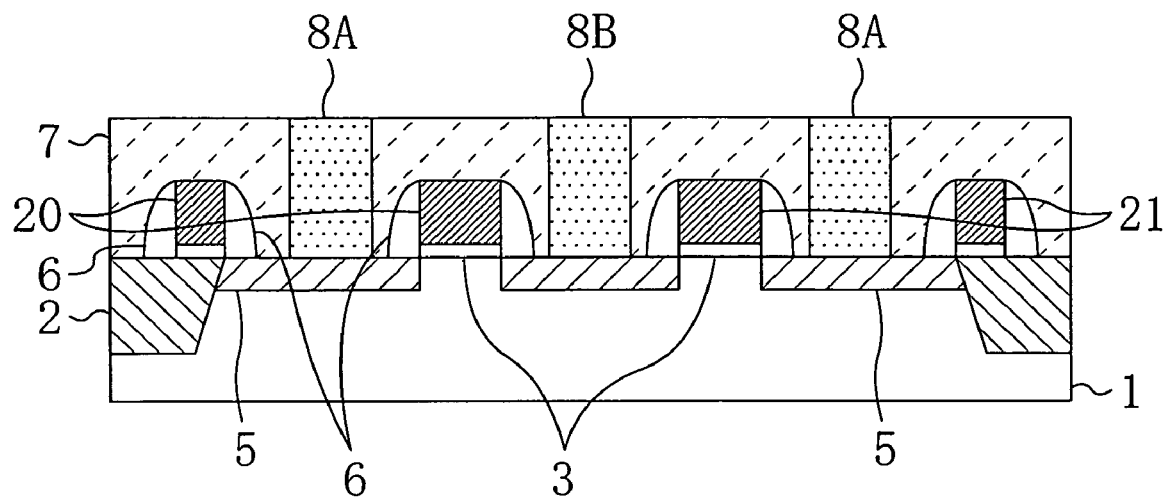
FIGS. 5A and 5B are cross-sectional views indicating process steps for fabricating the semiconductor memory device of the first embodiment of the present invention.
Figure 5B:
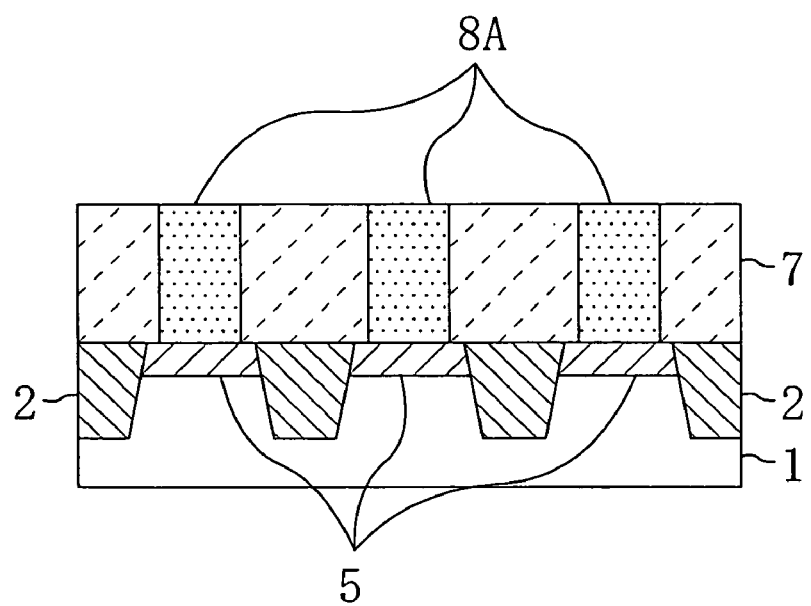

Next, as shown in FIGS. 5A and 5B, insulating sidewalls 6 are formed on the lateral faces of the gate electrodes 20 and dummy gate electrodes 21. Thereafter, although not shown, ion implantation for forming source/drain regions in the logic section is performed. The portions of the substrate surface and gate electrode surfaces located in the logic section are then silicided as necessary, and thereafter, a first interlayer dielectric film 7, made of a BPSG film, for example, is formed on the semiconductor substrate 1 as well as on the gate electrodes 20 and the dummy gate electrodes 21. In this step, a silicon nitride ($Si_3N_4$) film or the like may be formed under the first interlayer dielectric film 7. The surface of the first interlayer dielectric film 7 is then planarized by CMP (chemical mechanical polishing). After the planarization process, plugs 8A and a plug 8B are formed in the first interlayer dielectric film 7. Each plug 8A connects a doped layer 5 to a memory cell capacitor or to a dummy cell capacitor, while the plug 8B is formed to provide the connection between a doped layer 5 and a bit line. The plugs 8A and 8B are made of polysilicon, for example.

Figure 6A:
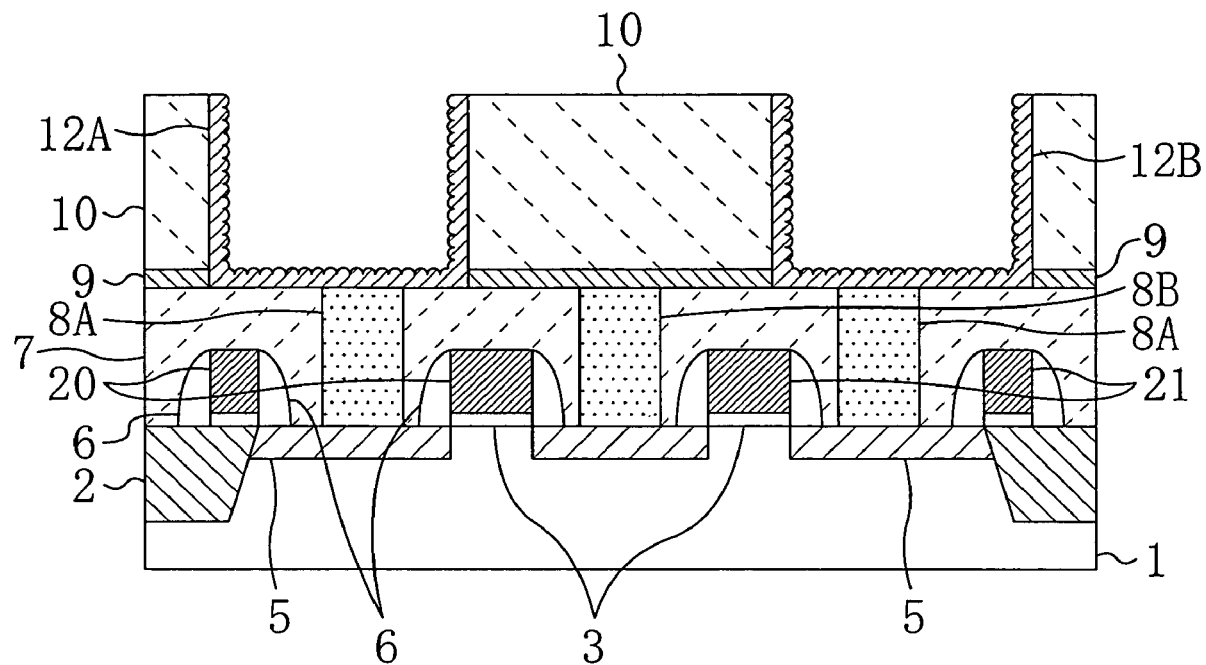
FIGS. 6A and 6B are cross-sectional views indicating process steps for fabricating the semiconductor memory device of the first embodiment of the present invention.
Figure 6B:
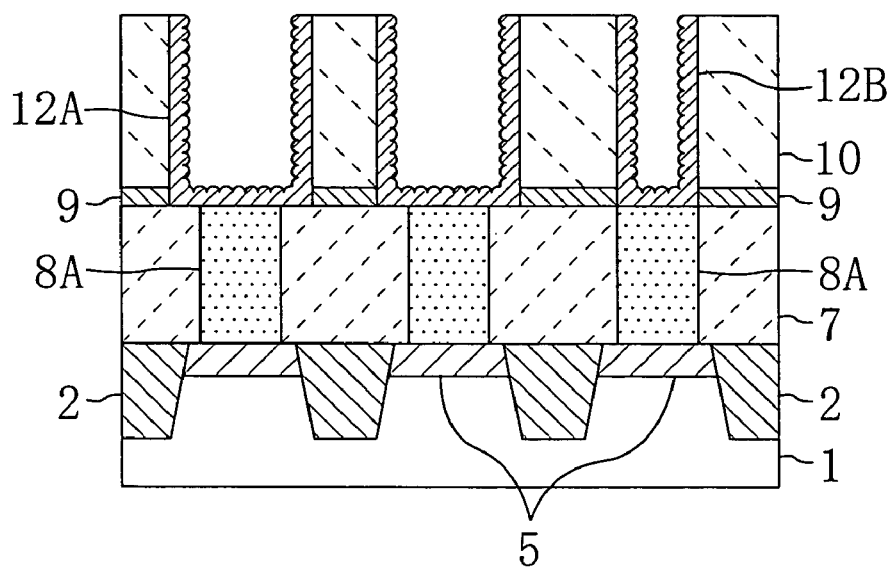

Subsequently, as shown in FIGS. 6A and 6B, a silicon nitride ($Si_3N_4$) film 9 is selectively formed in the memory cell regions and the dummy cell regions. A second interlayer dielectric film 10 made of a BPSG film, for example, is then formed over the entire surface of the semiconductor substrate 1. Thereafter, a resist pattern (not shown), having openings corresponding to lower-electrode formation regions and dummy lower-electrode formation regions, is formed. With the resist pattern used as a mask, the portions of the second interlayer dielectric film 10 and silicon nitride film 9 located in the regions in which lower electrodes 12A and dummy lower electrodes 12B are to be formed are selectively removed. By this step, recesses are formed, in which capacitors for the memory cells and capacitors for the dummy cells are to be formed. At this time, the upper surface of each plug 8A is exposed at the bottom of each capacitor formation recess. Thereafter, a HSG polysilicon film, for example, is formed over the entire surface of the semiconductor substrate 1, and then subjected to an etch-back process or a CMP process. By this process, the lower electrodes 12A and the dummy lower electrodes 12B, each of which is connected to a corresponding one of the plugs 8A, are formed on the wall and bottom faces of the memory-cell-capacitor formation recesses and on the wall and bottom faces of the dummy-cell-capacitor formation recesses, respectively.

Figure 7A:
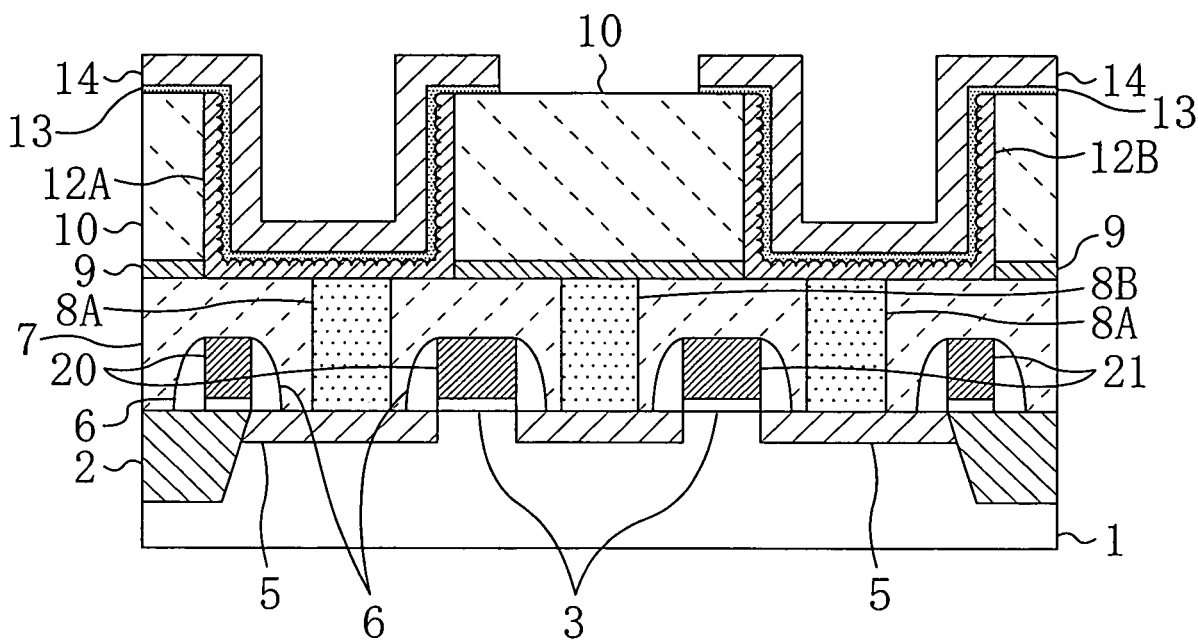
FIGS. 7A and 7B are cross-sectional views indicating process steps for fabricating the semiconductor memory device of the first embodiment of the present invention.
Figure 7B:
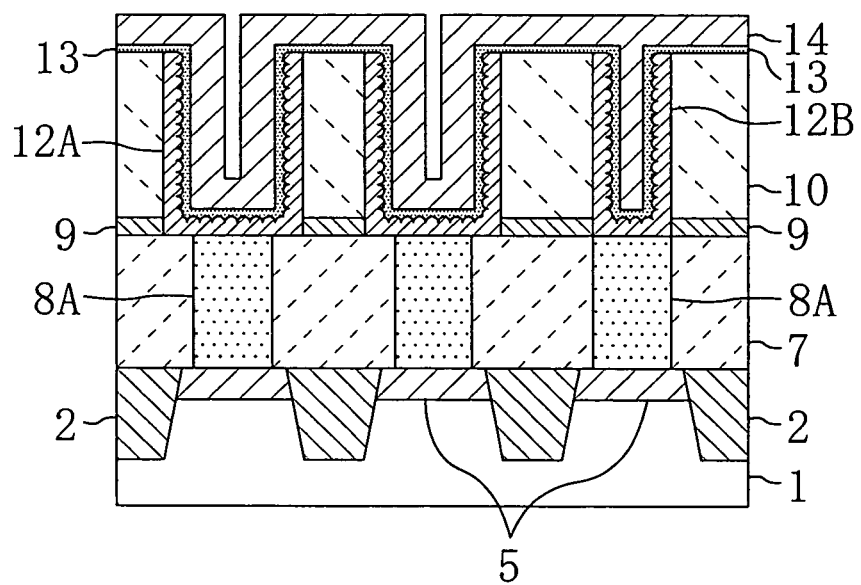

Next, as shown in FIGS. 7A and 7B, a capacitive insulating film 13 having a thickness of 10 nm and made of $Ta_2O_5$, for example, and an upper electrode 14 having a thickness of 50 nm and made of TiN, for example, are formed in this order over the memory cell regions including the lower electrodes 12A and over the dummy cell regions including the dummy lower electrodes 12B. By this step, the memory cell capacitors, composed of the lower electrodes 12A, the capacitive insulating film 13, and the upper electrode 14, are formed, while the dummy cell capacitors, composed of the dummy lower electrodes 12B, the capacitive insulating film 13, and the upper electrode 14, are formed.

Figure 8A:
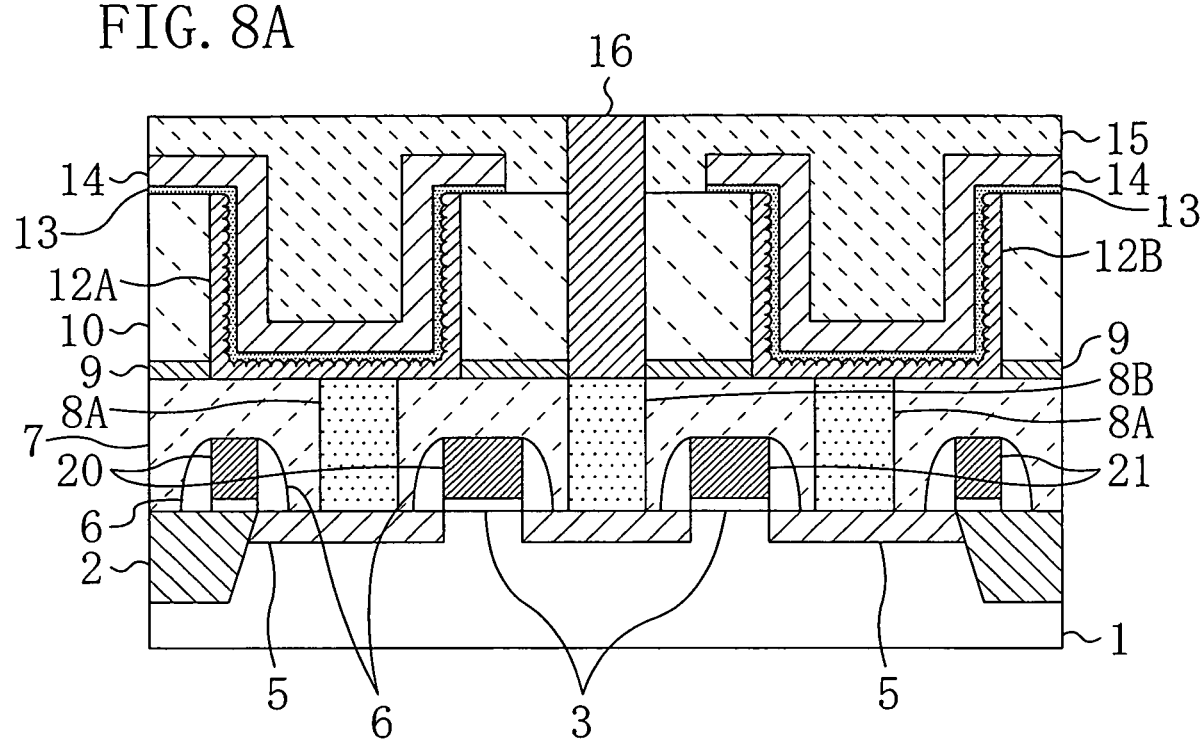
FIGS. 8A and 8B are cross-sectional views indicating process steps for fabricating the semiconductor memory device of the first embodiment of the present invention.
Figure 8B:
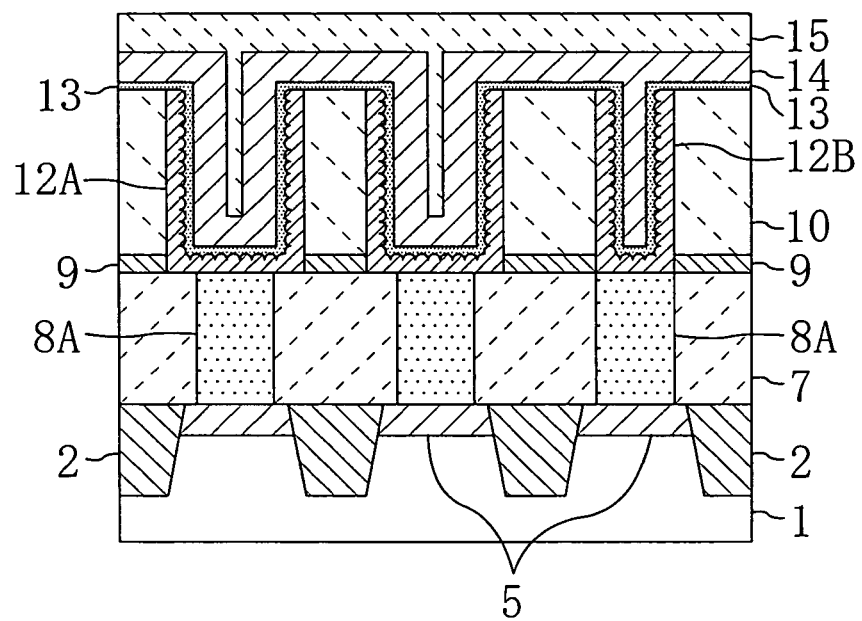

Then, as shown in FIGS. 8A and 8B, a third interlayer dielectric film 15 made of a NSG film, for example, is formed on the second interlayer dielectric film 10 as well as on the upper electrode 14, and the surface of the third interlayer dielectric film 15 is then planarized. Thereafter, a bit line contact 16, which is connected to the plug 8B, is formed through the silicon nitride film 9, the second interlayer dielectric film 10, and the third interlayer dielectric film 15. In this step, although not shown, a contact that is connected to the upper electrode 14 is formed in the third interlayer dielectric film 15.

In this embodiment, a NSG film, formed by a method in which high-density plasma (HDP) typically having excellent space-filling characteristics is used, is employed as the third interlayer dielectric film 15. The electric charge, injected into the upper electrode 14 as a result of the plasma treatment performed when the NSG film is formed, passes preferentially through the capacitive insulating film 13 in the dummy cells to the dummy lower electrodes 12B, as described above. Therefore, in the memory cells, the capacitive insulating film 13 is prevented from deteriorating due to the plasma damage.

Subsequently, multilayer interconnection (including the bit lines (wires) 17 shown in FIGS. 2A and 2B and main word lines (metal wires formed above the bit lines 17 and connected to the word lines (the gate electrodes 20) through contacts) is formed using known techniques to complete the DARM of this embodiment.

As described above, in the first embodiment, the charge-up damage caused in the process step performed after the formation of the memory cell capacitors can be absorbed into the dummy cells just by setting the transverse dimension of the dummy lower electrodes 12B shorter than that of the lower electrodes 12A. Consequently, the highly reliable DRAM memory cells are formed.

Also, according to the first embodiment, the dummy lower electrodes 12B, having the shorter transverse dimension, are formed simultaneously with the lower electrodes 12A. Therefore, the highly reliable DRAM memory cells can be formed just by adjusting the mask layout, without adding any new process steps.

Although the first embodiment is directed to the DRAM including the stacked capacitors, similar effects are also achievable in cases in which the inventive techniques of the first embodiment are applied to DRAMs that include trench capacitors. It is apparent that the inventive techniques of the first embodiment are also applicable to various types of memories other than DRAMs.

Second Embodiment

Hereinafter, a semiconductor memory device and a method for fabricating the same according to a second embodiment of the present invention will be described with reference to the accompanying drawings.

Figure 9:
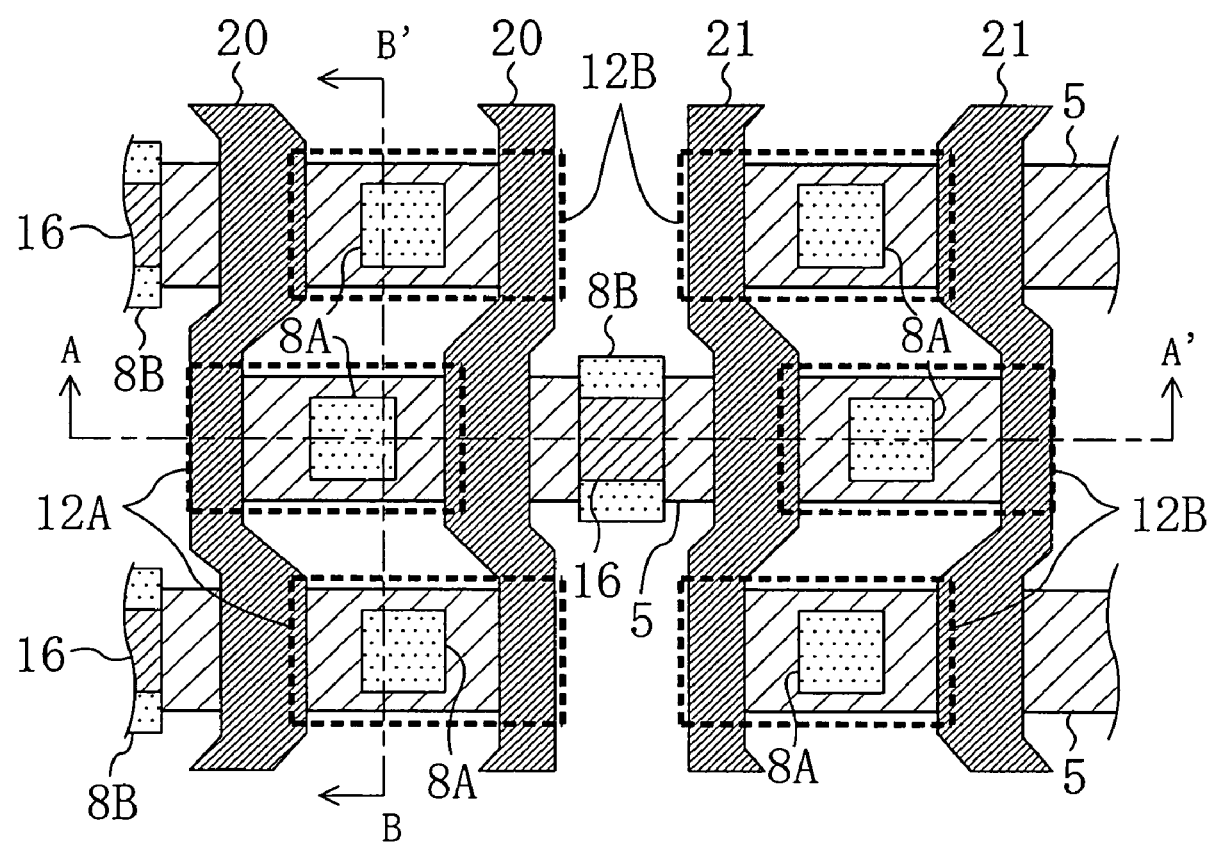
FIG. 9 is a plan view of a semiconductor memory device according to a second embodiment of the present invention.
Figure 10A:
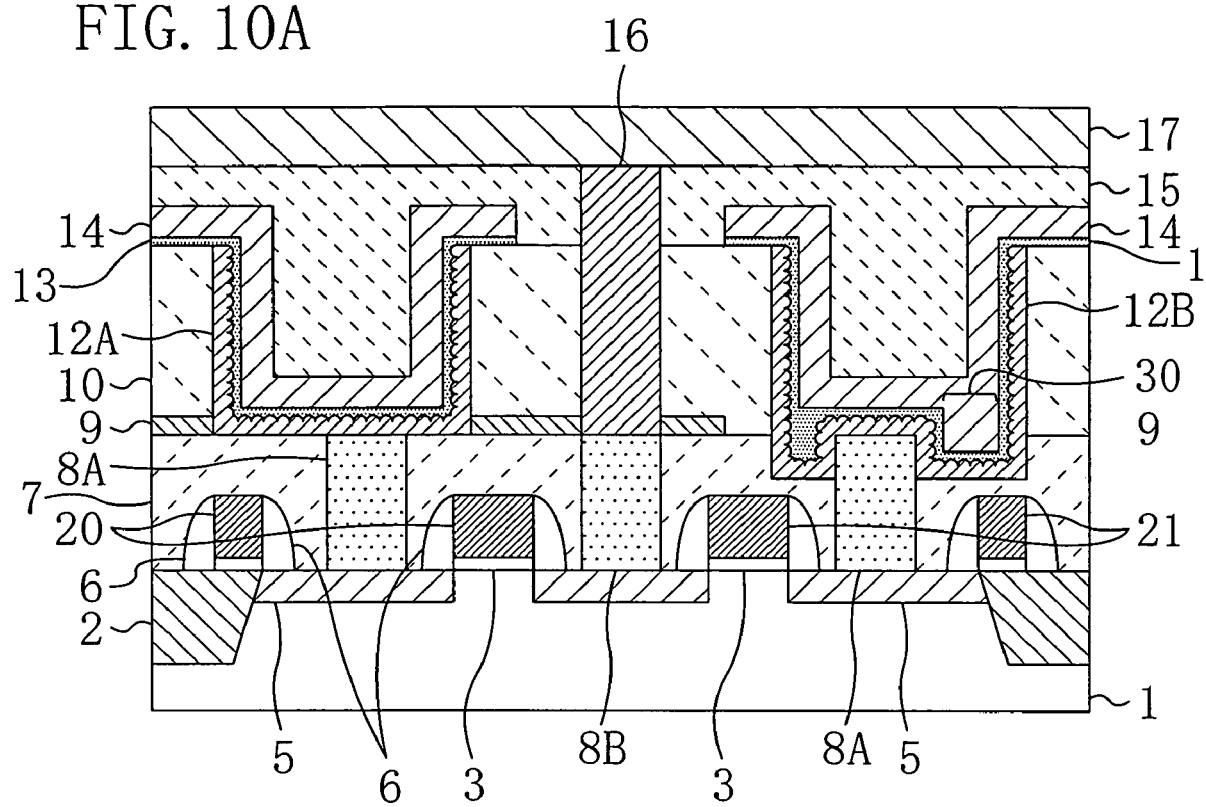
FIGS. 10A and 10B are cross-sectional views of the semiconductor memory device of the second embodiment of the present invention.
Figure 10B:
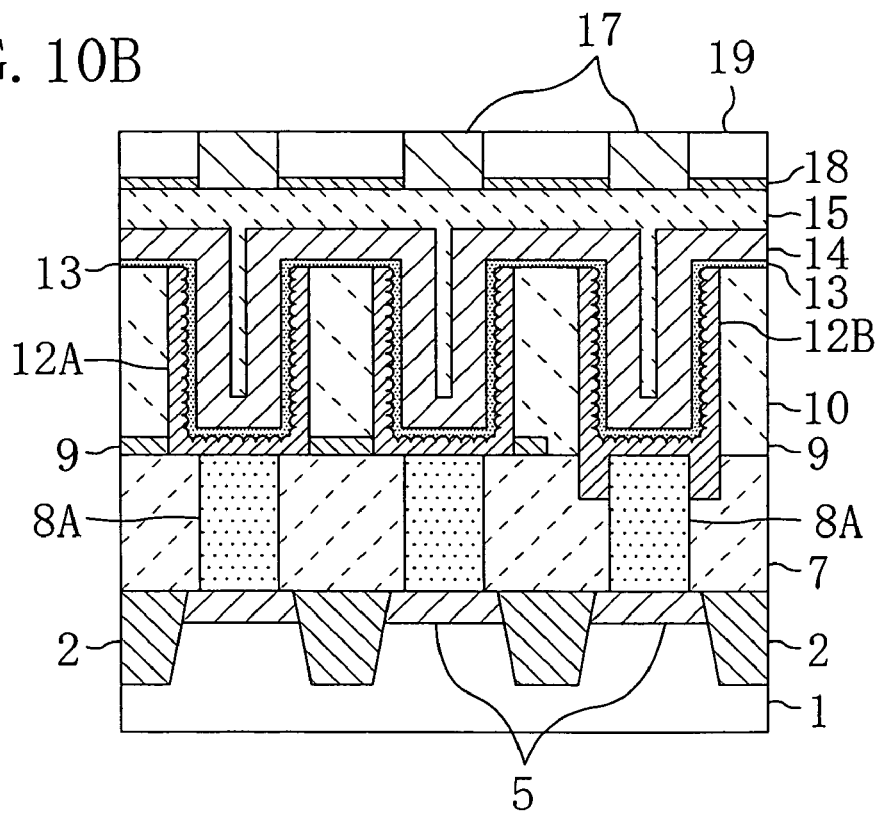

FIG. 9 is a plan view illustrating memory cells in a semiconductor memory device (specifically, a DRAM) according to the second embodiment. FIGS. 10A and 10B are the cross-sectional views taken along the lines A-A' and B-B' of FIG. 9, respectively. In FIG. 9 and FIGS. 10A and 10B, the same components as those of the first embodiment shown in FIG. 1 and FIGS. 2A and 2B are identified by the same reference numerals, and descriptions thereof are thus omitted herein. In FIG. 9, illustration of some components is omitted.

The second embodiment differs from the first embodiment in the following respects. As shown in FIG. 9 and FIGS. 10A and 10B, in dummy cell regions, a silicon nitride film 9, which is used as an etching stopper when lower electrodes are formed, is removed. This allows the bottom of each dummy lower electrode 12B to have a projection and a recess so that at least part of the bottom of the dummy lower electrode 12B is located lower than the upper surface of the plug 8A connected to the dummy lower electrode 12B. More specifically, as shown in FIG. 10A, each dummy lower electrode 12B is formed with a narrow-width recess 30 located alongside the plug 8A connected to the dummy lower electrode 12B, while no lower electrodes 12A in the memory cells include such a recess. Therefore, as described in the first embodiment with reference to FIG. 3, the amount of leakage current produced per unit area in the narrow-width recess 30 formation portions in the dummy cell capacitors is increased as compared with the memory ell capacitors. In other words, the leakage current is likely to pass through the dummy cell capacitors. Thus, even if plasma damage is caused in a process step after the formation of the memory cell capacitors, the electric charge (leakage current) produced by the plasma damage passes preferentially through the dummy cell capacitors. Consequently, in the memory cells, charge-up damage in the capacitive insulating film 13 can be avoided.

In the second embodiment, unlike in the first embodiment, the transverse dimension of the lower electrodes 12A is equal to the transverse dimension of the dummy lower electrodes 12B as shown in FIG. 9 and FIGS. 10A and 10B.

Next, it will be described how to fabricate the semiconductor memory device of the second embodiment with reference to the accompanying figures.

FIGS. 11A, 11B, 12A, 12B, 13A, 13B, 14A, 14B, 15A, 15B, 16A, 16B, 17A, 17B, 18A, and 18B are cross-sectional views indicating process steps for fabricating the semiconductor memory device of the second embodiment. FIGS. 11A, 12A, 13A, 14A, 15A, 16A, 17A, and 18A correspond to the cross-sectional structure taken along the line A-A' of FIG. 9, while FIGS. 11B, 12B, 13B, 14B, 15B, 16B, 17B, and 18B correspond to the cross-sectional structure taken along the line B-B' of FIG. 9.

Figure 11A:
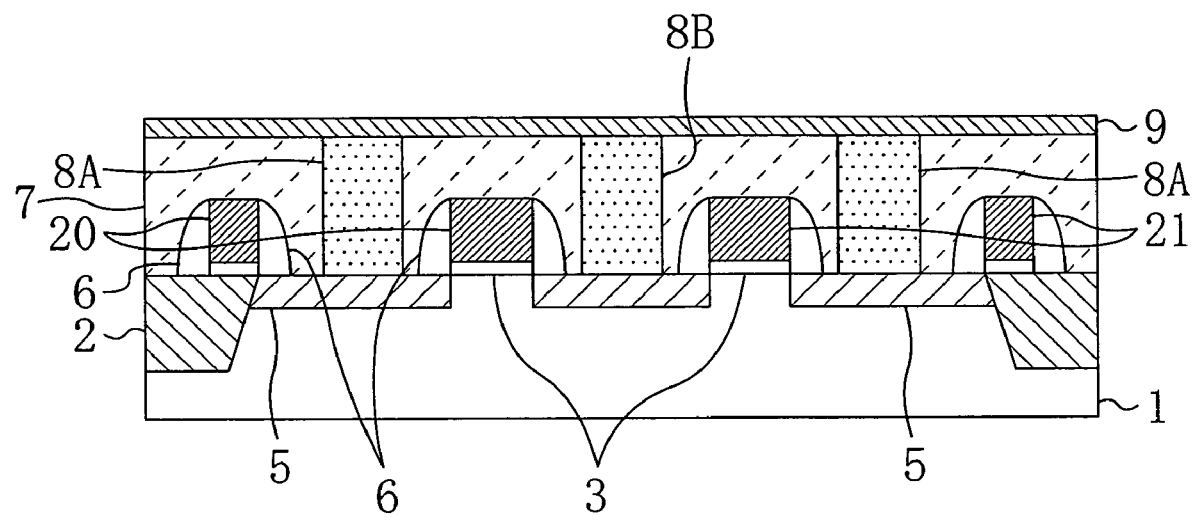
FIGS. 11A and 11B are cross-sectional views indicating process steps for fabricating the semiconductor memory device of the second embodiment of the present invention.
Figure 11B:
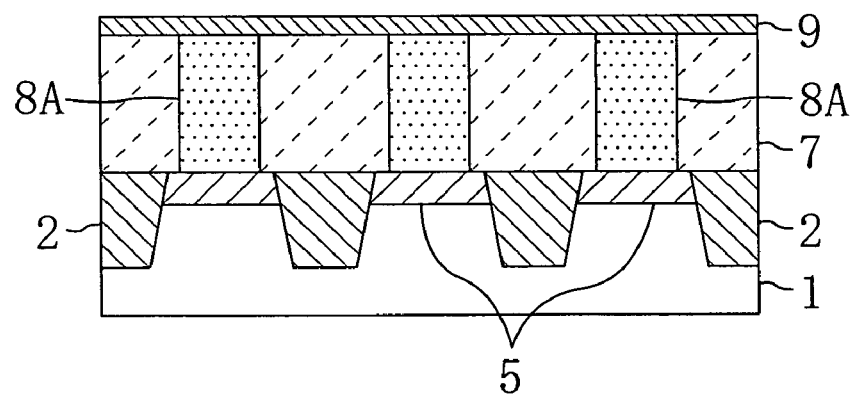
Figure 12A:
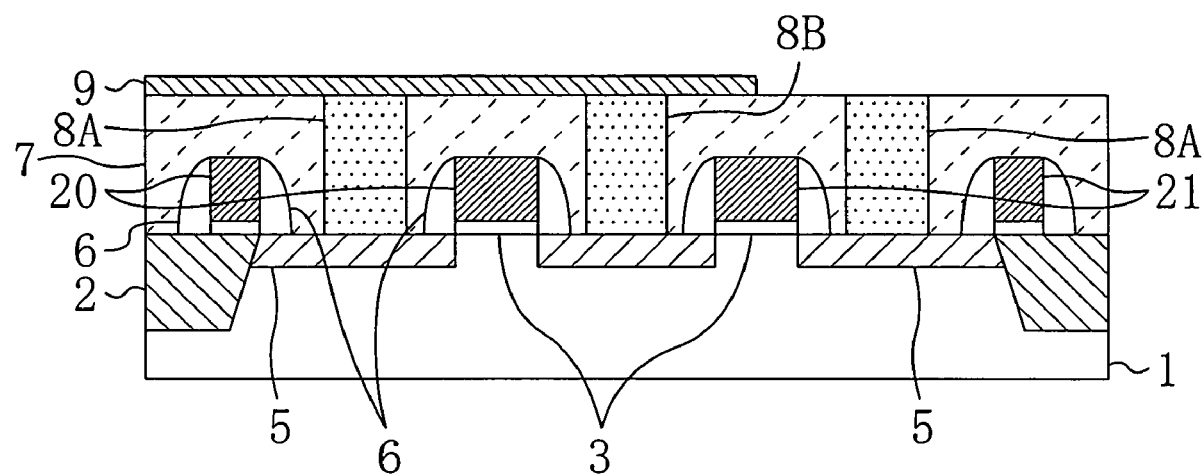
FIGS. 12A and 12B are cross-sectional views indicating process steps for fabricating the semiconductor memory device of the second embodiment of the present invention.
Figure 12B:
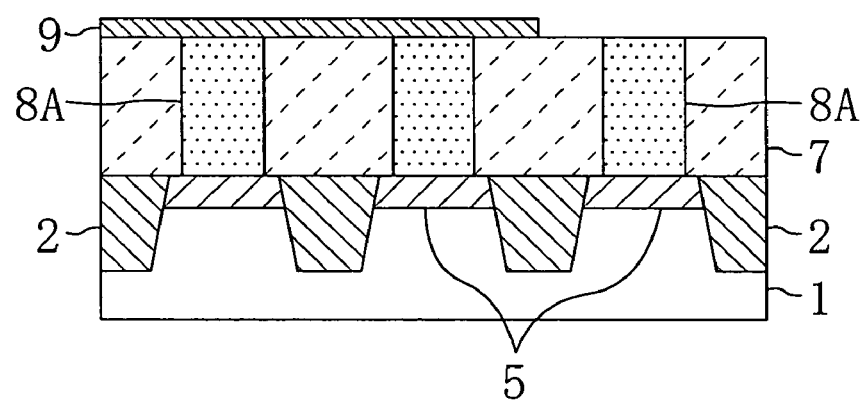

First, plugs 8A and 8B are formed in a first interlayer dielectric film 7 in the same manner as described in the process steps of the first embodiment shown in FIGS. 4A, 4B, 5A, and 5B. Then, as shown in FIGS. 11A and 11B, a silicon nitride film 9 is formed on the entire surface of the first interlayer dielectric film 7. Thereafter, as shown in FIGS. 12A and 12B, the portions of the silicon nitride film 9 located in dummy cell regions are selectively removed. In other words, only the portions of the silicon nitride film 9 located in memory cell regions are left.

Figure 13A:
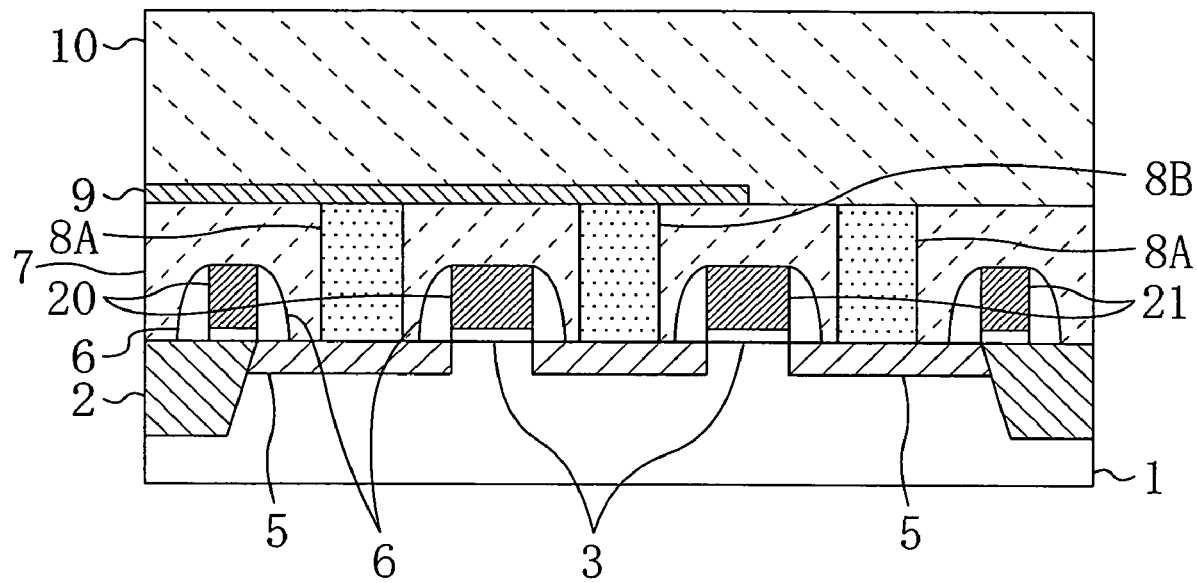
FIGS. 13A and 13B are cross-sectional views indicating process steps for fabricating the semiconductor memory device of the second embodiment of the present invention.
Figure 13B:
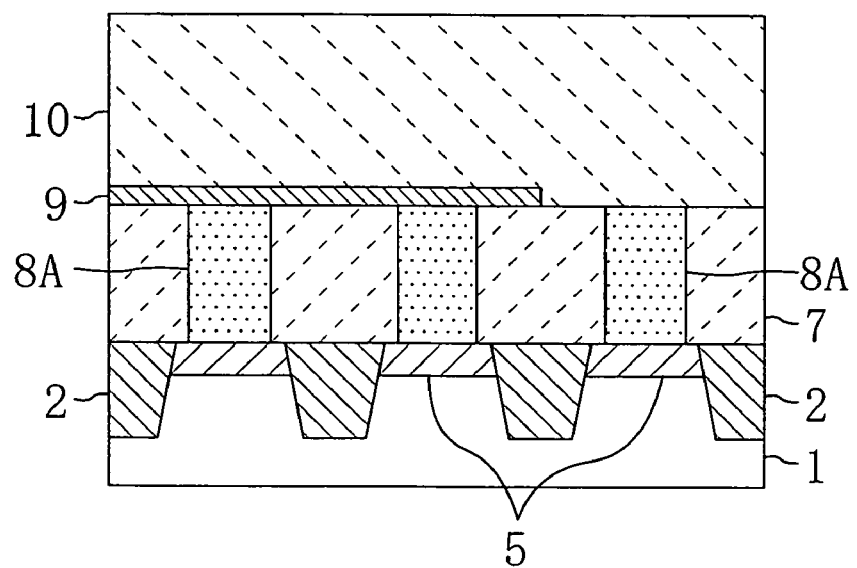
Figure 14A:
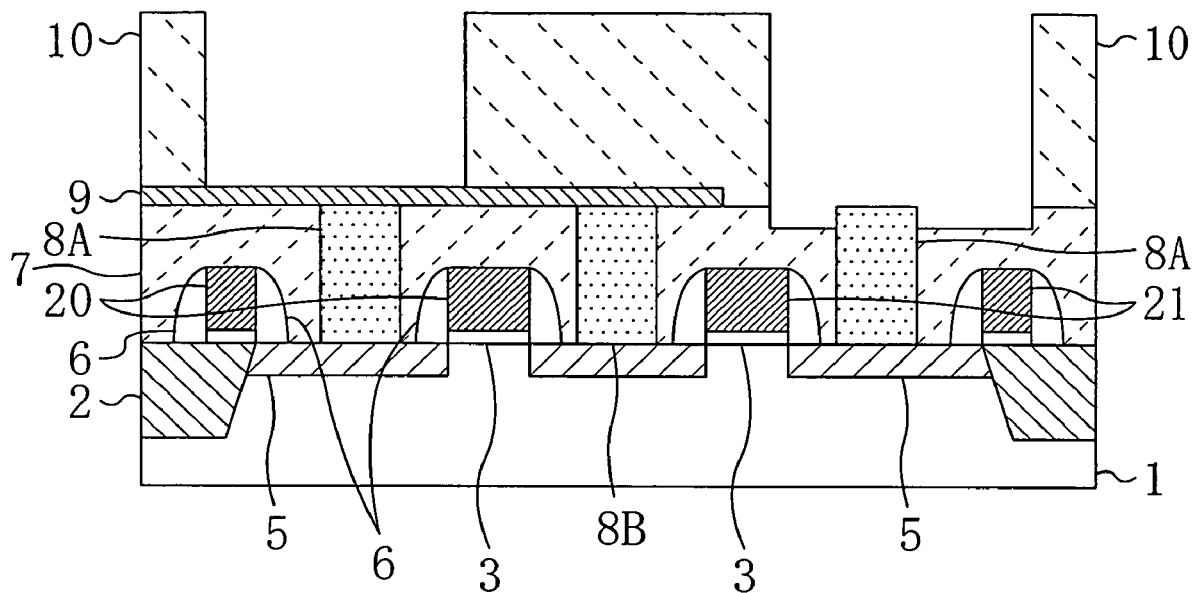
FIGS. 14A and 14B are cross-sectional views indicating process steps for fabricating the semiconductor memory device of the second embodiment of the present invention.
Figure 14B:
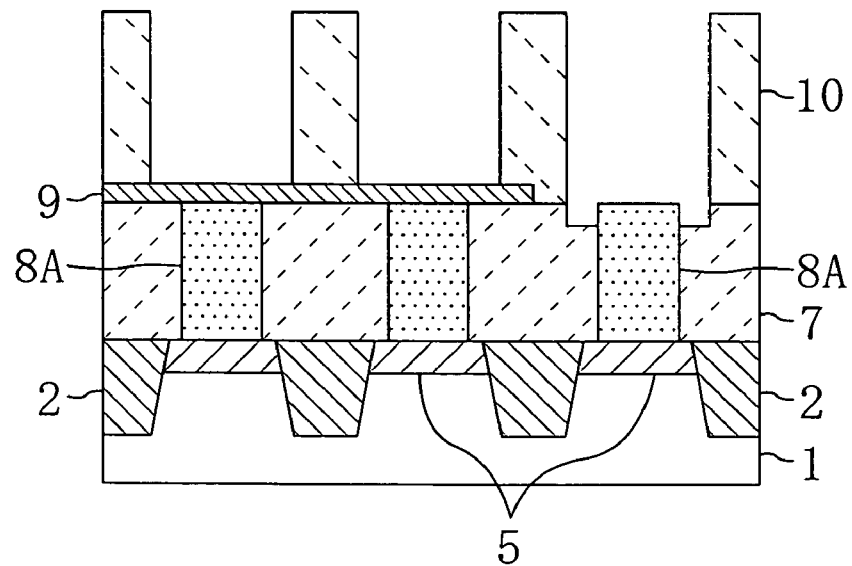

Next, as shown in FIGS. 13A and 13B, a second interlayer dielectric film 10 made of a BPSG film, for example, is formed over the entire surface of the semiconductor substrate 1. Thereafter, a resist pattern (not shown), having openings corresponding to lower-electrode formation regions and dummy-lower-electrode formation regions, is formed. With the resist pattern used as a mask, the portions of the second interlayer dielectric film 10 located in the regions in which lower electrodes 12A and dummy lower electrodes 12B are to be formed are selectively removed, as shown in FIGS. 14A and 14B. By this step, recesses are formed, in which capacitors for the memory cells and capacitors for the dummy cells are to be formed. In this step, in the memory cell regions, the remaining silicon nitride film 9 functions as an etching stopper, so that the etching of the second interlayer dielectric film 10 is stopped when the silicon nitride film 9 is reached. In the dummy cell regions, however, since the silicon nitride film 9 is not present under the second interlayer dielectric film 10, part of the first interlayer dielectric film 7 is etched after the second interlayer dielectric film 10, which consequently exposes the upper portions of those plugs 8A that are to be connected to the dummy lower electrodes 12B.

Figure 15A:
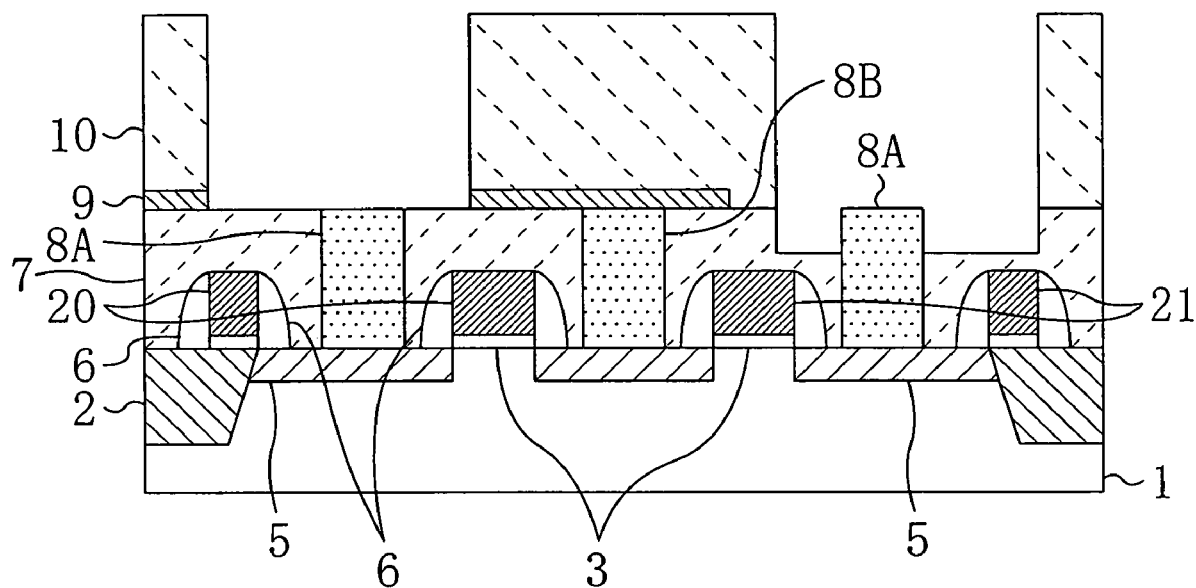
FIGS. 15A and 15B are cross-sectional views indicating process steps for fabricating the semiconductor memory device of the second embodiment of the present invention.
Figure 15B:
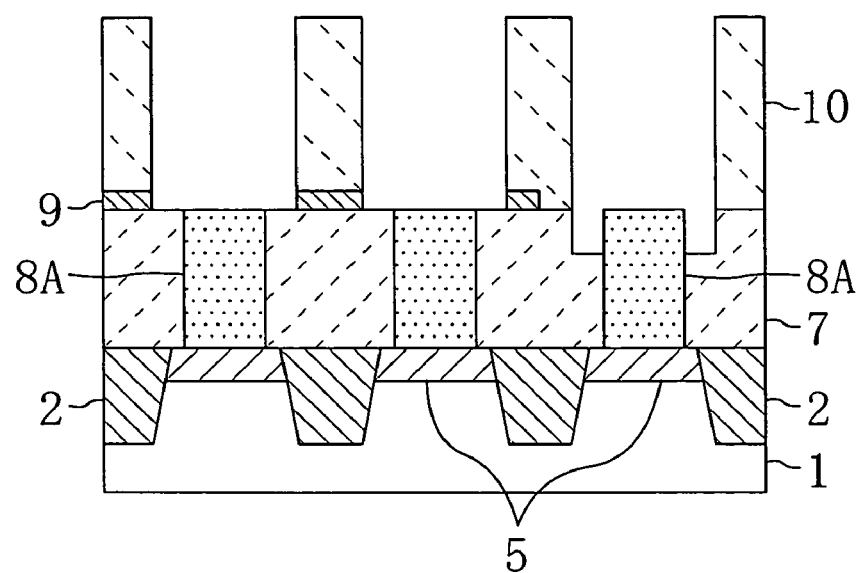

Thereafter, with the resist pattern used as a mask, the portions of the silicon nitride film 9 that are exposed in the memory-cell-capacitor formation recesses are removed as shown in FIGS. 15A and 15B, whereby the upper surfaces of those plugs 8A to be connected to the lower electrodes 12A are exposed at the recess bottoms. In this step, the portions of the first interlayer dielectric film 7 exposed in the dummy-cell-capacitor formation recesses are etched further, such that the upper portions of those plugs 8A to be connected to the dummy lower electrodes 12B are exposed further.

Figure 16A:
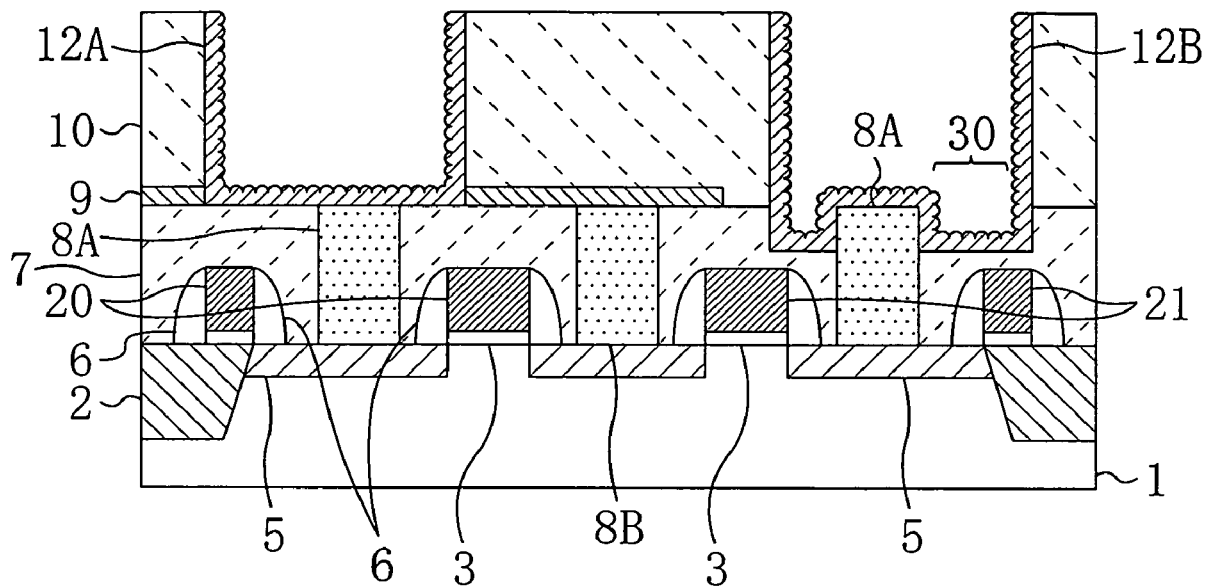
FIGS. 16A and 16B are cross-sectional views indicating process steps for fabricating the semiconductor memory device of the second embodiment of the present invention.
Figure 16B:
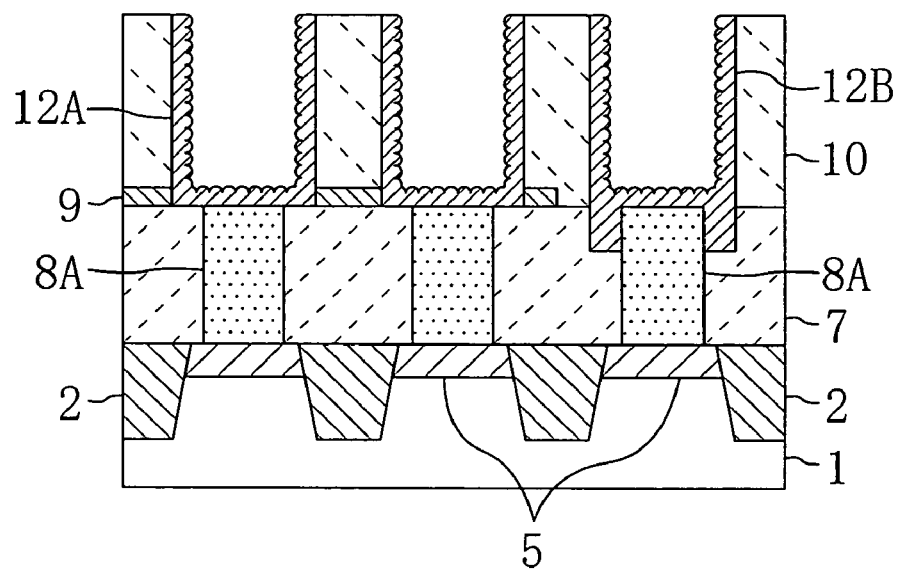

Next, as shown in FIGS. 16A and 16B, a HSG polysilicon film, for example, is formed over the entire surface of the semiconductor substrate 1, and then subjected to an etch-back process or a CMP process. By this process, the lower electrodes 12A and the dummy lower electrodes 12B, which are connected to the plugs 8A, are formed on the wall and bottom faces of the memory-cell-capacitor formation recesses and on the wall and bottom faces of the dummy-cell-capacitor formation recesses, respectively. At this time, in each dummy-cell-capacitor formation recess, the portion of the first interlayer dielectric film 7 located around the plug 8A has been etched so that the plug 8A projects from the remaining first interlayer dielectric film 7. Therefore, a projection and a recess are formed in the bottom of each dummy lower electrode 12B so that at least part of the bottom of the dummy lower electrode 12B is located lower than the upper surface of the plug 8A. More specifically, each dummy lower electrode 12B is formed with a narrow-width recess 30 located alongside the plug 8A, while no lower electrodes 12A in the memory cells have such a recess.

Figure 17A:
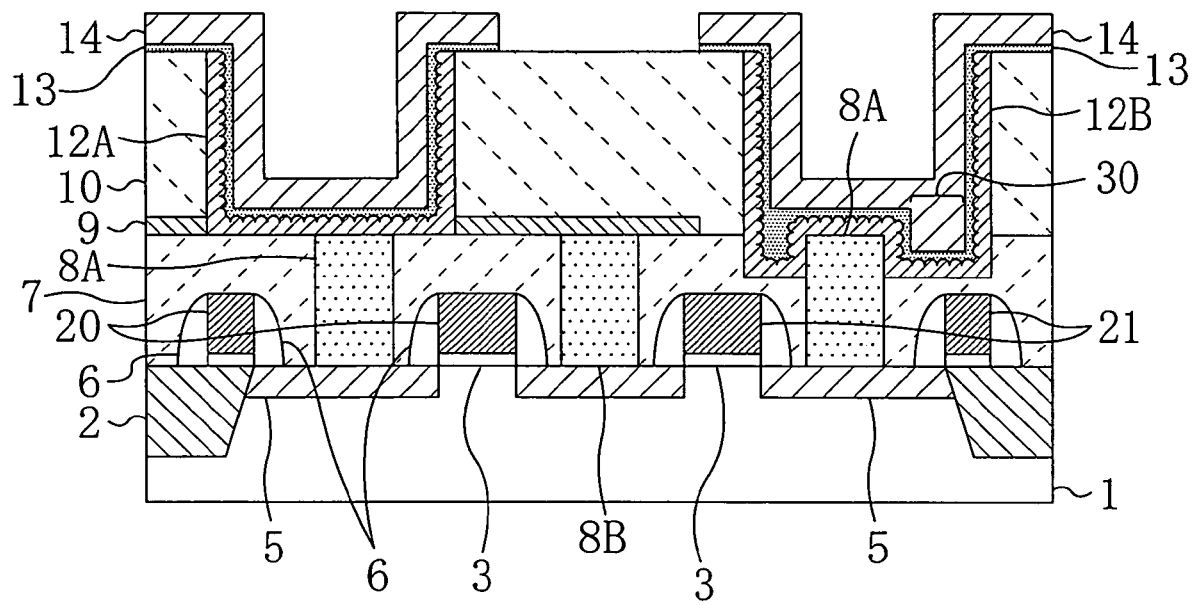
FIGS. 17A and 17B are cross-sectional views indicating process steps for fabricating the semiconductor memory device of the second embodiment of the present invention.
Figure 17B:
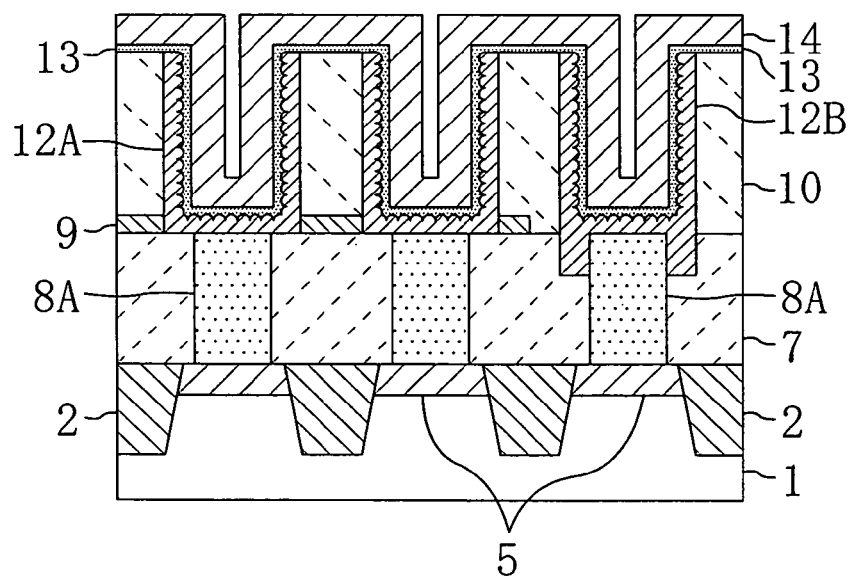

Next, as shown in FIGS. 17A and 17B, a capacitive insulating film 13 having a thickness of 10 nm and made of $Ta_2O_5$, for example, and an upper electrode 14 having a thickness of 50 nm and made of TiN, for example, are formed in this order over the memory cell regions including the lower electrodes 12A and over the dummy cell regions including the dummy lower electrodes 12B. By this step, the memory cell capacitors, composed of the lower electrodes 12A, the capacitive insulating film 13, and the upper electrode 14, are formed, while the dummy cell capacitors, composed of the dummy lower electrodes 12B, the capacitive insulating film 13, and the upper electrode 14, are formed.

Figure 18A:
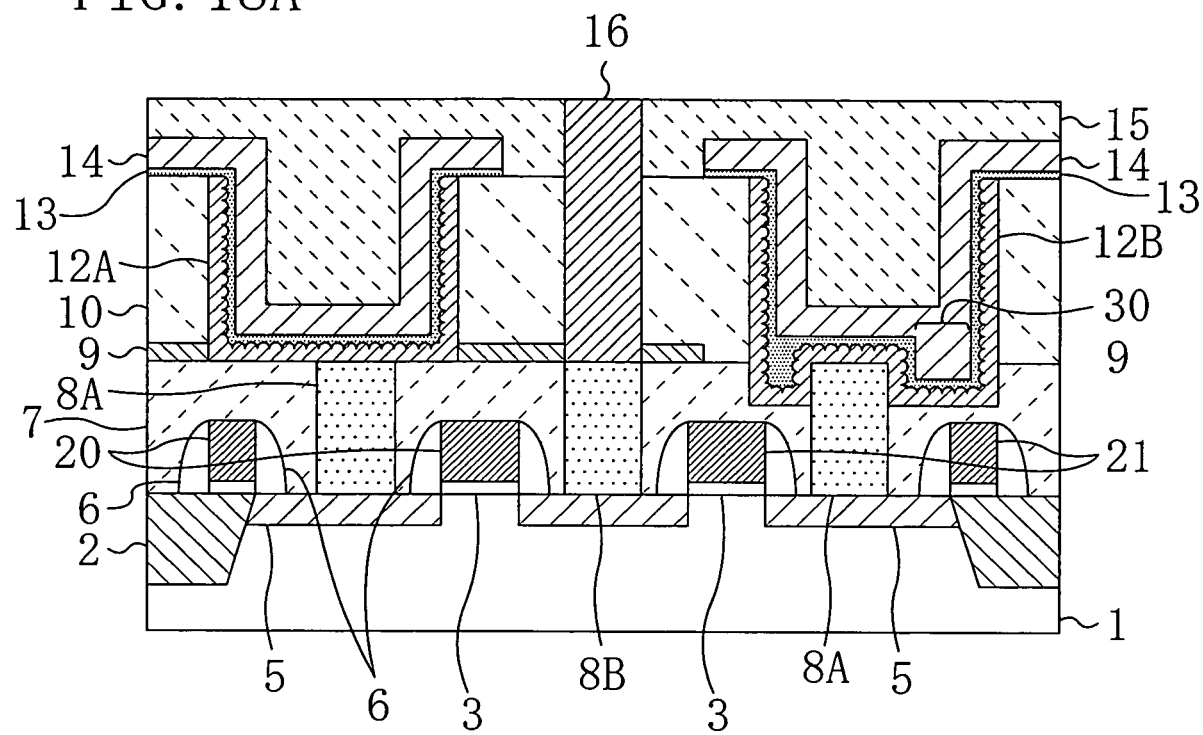
FIGS. 18A and 18B are cross-sectional views indicating process steps for fabricating the semiconductor memory device of the second embodiment of the present invention.
Figure 18B:
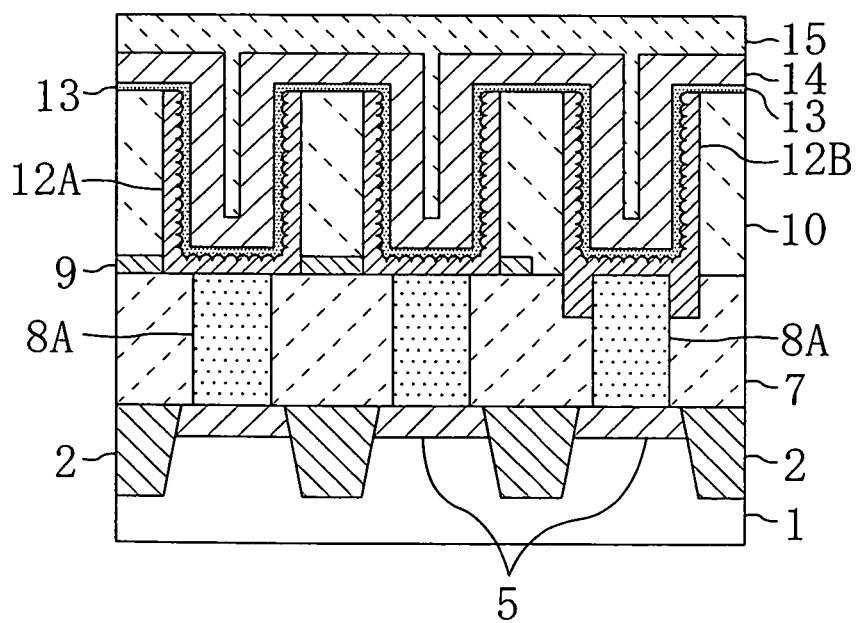

Then, as shown in FIGS. 18A and 18B, a third interlayer dielectric film 15 made of a NSG film, for example, is formed on the second interlayer dielectric film 10 as well as on the upper electrode 14, and the surface of the third interlayer dielectric film 15 is then planarized. Then, a bit line contact 16, which is connected to the plug 8B, is formed through the silicon nitride film 9, the second interlayer dielectric film 10, and the third interlayer dielectric film 15. In this step, although not shown, a contact that is connected to the upper electrode 14 is formed in the third interlayer dielectric film 15.

In this embodiment, a NSG film, formed by a method in which high-density plasma (HDP) typically having excellent space-filling characteristics is used, is employed as the third interlayer dielectric film 15. The electric charge, injected into the upper electrode 14 as a result of the plasma treatment performed when the NSG film is formed, passes preferentially through the capacitive insulating film 13 in the dummy cells to the dummy lower electrodes 12B, as described above. Therefore, in the memory cells, the capacitive insulating film 13 is prevented from deteriorating due to the plasma damage.

Subsequently, multilayer interconnection (including the bit lines (wires) 17 shown in FIGS. 10A and 10B and main word lines (metal wires formed above the bit lines 17 and connected to the word lines (the gate electrodes 20) through contacts) is formed using known techniques to complete the DARM of this embodiment.

As described above, in the second embodiment, the silicon nitride film 9, which is used as the etching stopper when the lower electrodes are formed, is patterned so that the portions of the silicon nitride film 9 located in the dummy cell regions are removed. Just by doing this removal, the minute recesses 30 are formed in the dummy lower electrodes 12B, whereby leakage current is likely to pass through the recess 30 formation portions in the dummy cell capacitors. That is, the charge-up damage caused in the process step performed after the formation of the memory cell capacitors can be absorbed into the dummy cells. Therefore, the highly reliable DRAM memory cells are formed.

In the second embodiment, the silicon nitride film 9, which is used as the etching stopper when the lower electrodes are formed, is patterned so that the portions of the silicon nitride film 9 located in the dummy cell regions are removed. Therefore, the highly reliable DRAM memory cells can be formed just by adjusting the mask layout, without adding any new process steps.

Also, it is apparent that the second embodiment may be applied to various types of memories other than DRAMs.

Moreover, in the second embodiment, the transverse dimension of the dummy lower electrodes 12B may be made shorter than that of the lower electrodes 12A as in the first embodiment. Then, leakage current is more likely to pass through the dummy cell capacitors.

Third Embodiment

Hereinafter, a semiconductor memory device and a method for fabricating the same according to a third embodiment of the present invention will be described with reference to the accompanying drawings.

Figure 19:
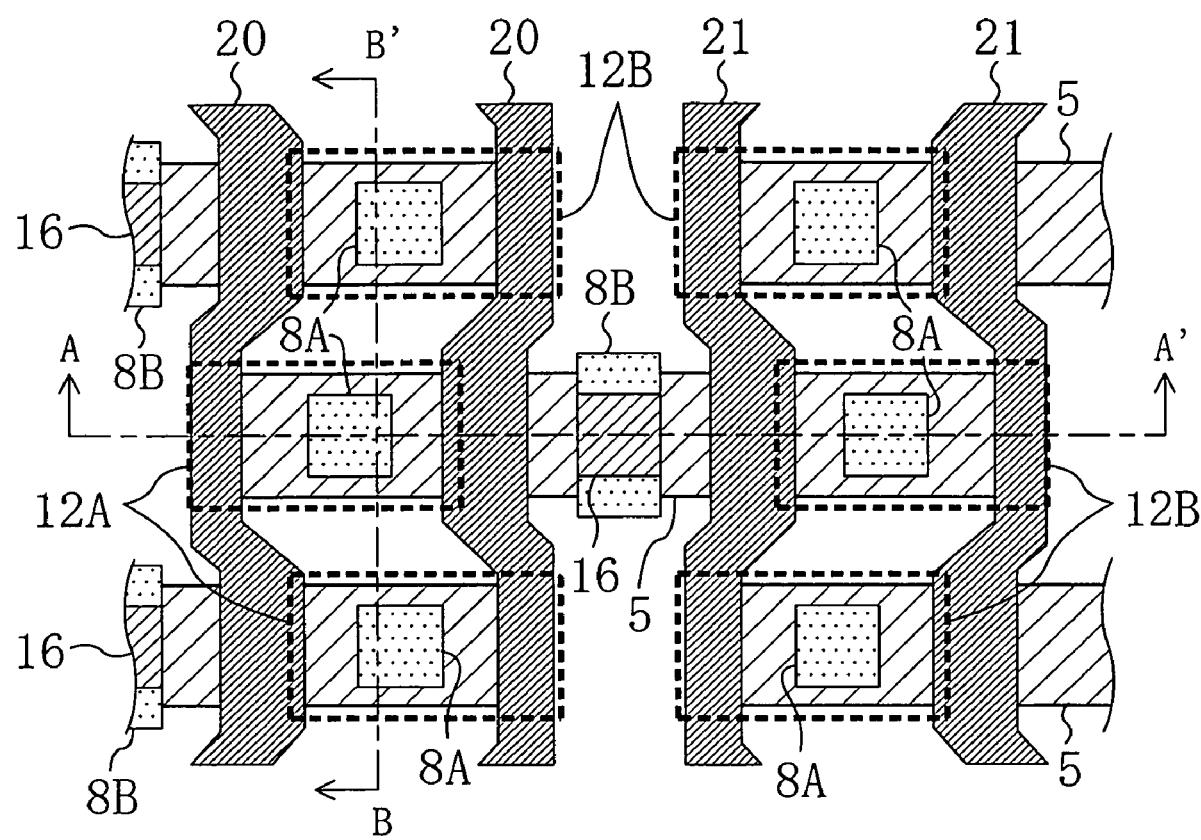
FIG. 19 is a plan view of a semiconductor memory device according to a third embodiment of the present invention.
Figure 20A:
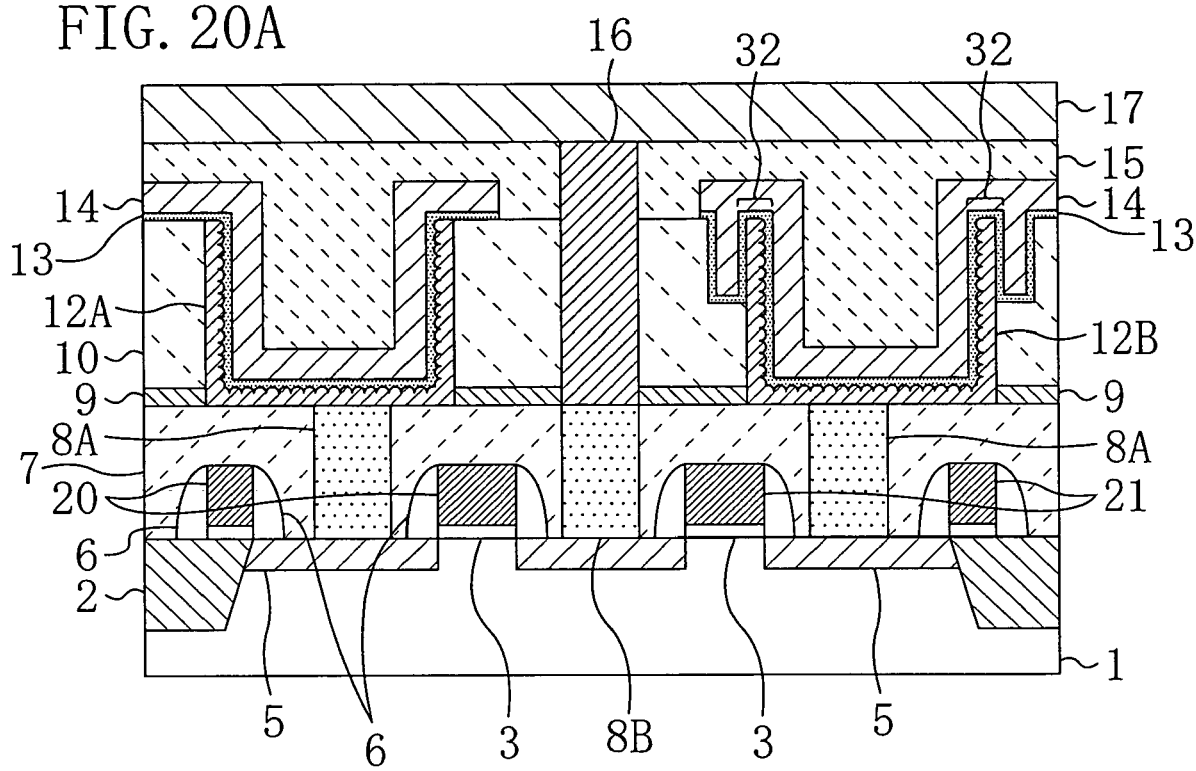
FIGS. 20A and 20B are cross-sectional views of the semiconductor memory device of the third embodiment of the present invention.
Figure 20B:
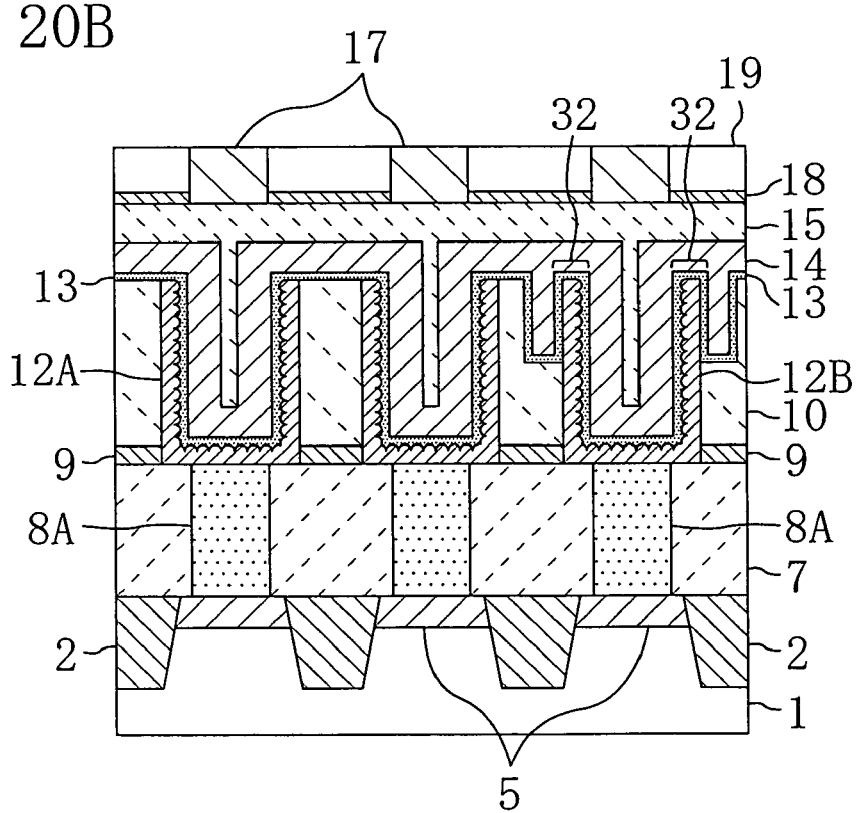

FIG. 19 is a plan view illustrating memory cells in a semiconductor memory device (specifically, a DRAM) according to the third embodiment. FIGS. 20A and 20B are the cross-sectional views taken along the lines A-A' and B-B' of FIG. 19, respectively. In FIG. 19 and FIGS. 20A and 20B, the same components as those of the first embodiment shown in FIG. 1 and FIGS. 2A and 2B are identified by the same reference numerals, and descriptions thereof are thus omitted herein. In FIG. 19, illustration of some components is omitted.

The third embodiment differs from the first embodiment in the following respects. As shown in FIG. 19 and FIGS. 20A and 20B, the inner wall surface and part of the outer wall surface of each dummy lower electrode 12B, which has a hollow cylindrical shape, oppose an upper electrode 14 with a capacitive insulating film 13 interposed therebetween. More specifically, each dummy lower electrode 12B has a projection 32, and capacitance is formed on both sides of the projection 32 (that is, the inner and outer sides of the wall portion of the dummy lower electrode 12B). On the other hand, each lower electrode 12A, having a hollow cylindrical shape, is configured so that only the inner wall surface thereof opposes the upper electrode 14 with the capacitive insulating film 13 interposed therebetween as in the first embodiment.

Therefore, leakage current is likely to pass through the projections 32 of the dummy lower electrodes 12B because of electric field concentration produced in the projections 32. In other words, the amount of leakage current produced per unit area in the projections 32 in the dummy cell capacitors is larger than that in the memory cell capacitors. Thus, even if plasma damage is caused in a process step performed after the formation of the memory cell capacitors, the electric charge (leakage current) produced by the plasma damage passes preferentially through the dummy cell capacitors. It is thus possible to avoid charge-up damage in the capacitive insulating film 13 in the memory cells.

In the third embodiment, unlike in the first embodiment, the transverse dimension of the lower electrodes 12A is equal to that of the dummy lower electrodes 12B as shown in FIG. 19 and FIGS. 20A and 20B.

Next, it will be described how to fabricate the semiconductor memory device of the third embodiment with reference to the accompanying figures.

FIGS. 21A, 21B, 22A, 22B, 23A, 23B, 24A, and 24B are cross-sectional views indicating process steps for fabricating the semiconductor memory device of the third embodiment. FIGS. 21A, 22A, 23A, and 24A correspond to the cross-sectional structure taken along the line A-A' of FIG. 19, while FIGS. 21B, 22B, 23B, and 24B correspond to the cross-sectional structure taken along the line B-B' of FIG. 19.

First, lower electrodes 12A and dummy lower electrodes 12B are formed on the wall and bottom surfaces of memory-cell-capacitor formation recesses and on the wall and bottom surfaces of dummy-cell-capacitor formation recesses, respectively, in the same manner as described in the process steps of the first embodiment shown in FIGS. 4A, 4B, 5A, 5B, 6A, and 6B. Each of the lower electrodes 12A and dummy lower electrodes 12B is connected to a plug 8A and has a hollow cylindrical shape.

Figure 21A:
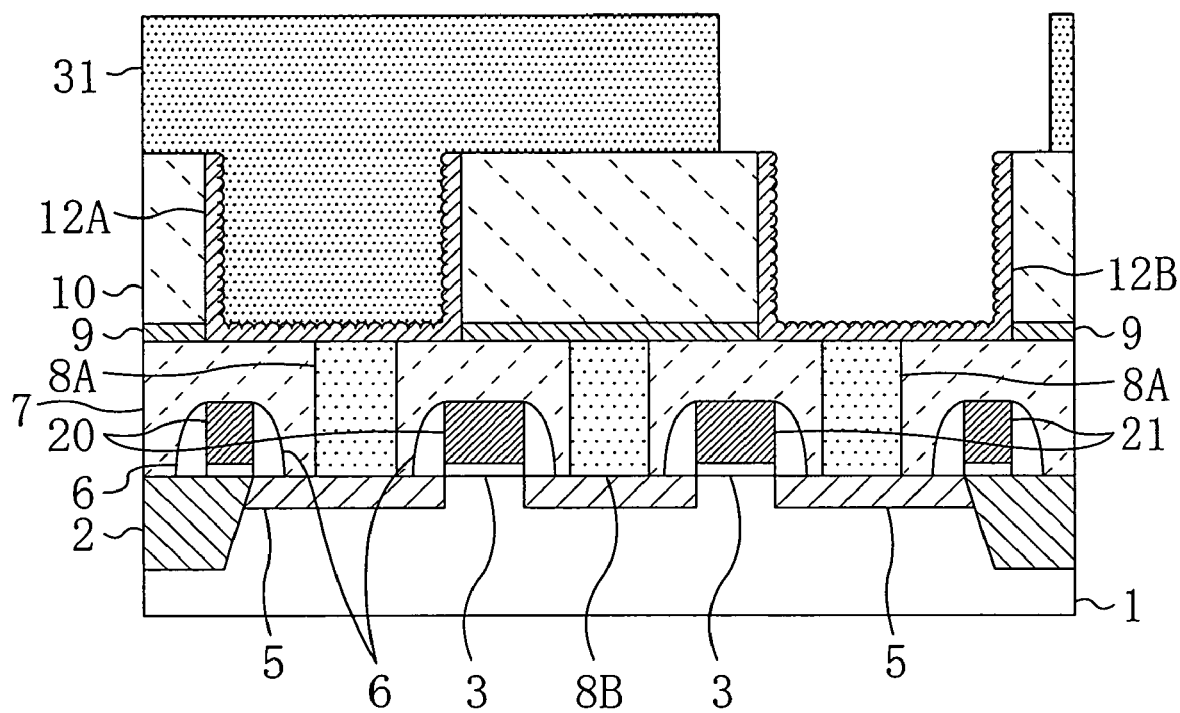
FIGS. 21A and 21B are cross-sectional views indicating process steps for fabricating the semiconductor memory device of the third embodiment of the present invention.
Figure 21B:
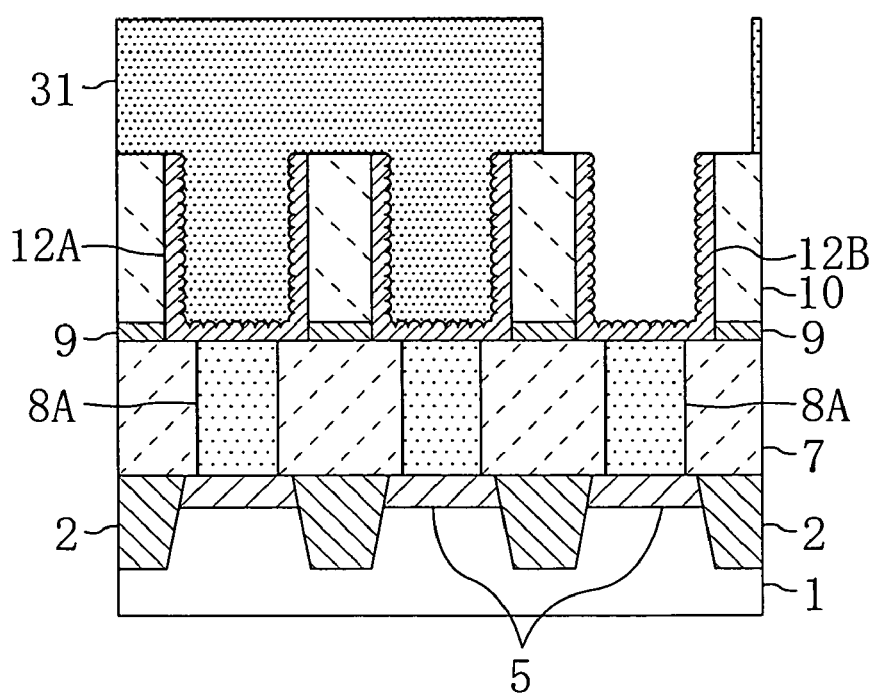

Then, as shown in FIGS. 21A and 21B, a resist pattern 31 is formed, which has openings exposing the dummy lower electrodes 12B and portions of a second interlayer dielectric film 10 that are located close to the dummy lower electrodes 12B.

Figure 22A:
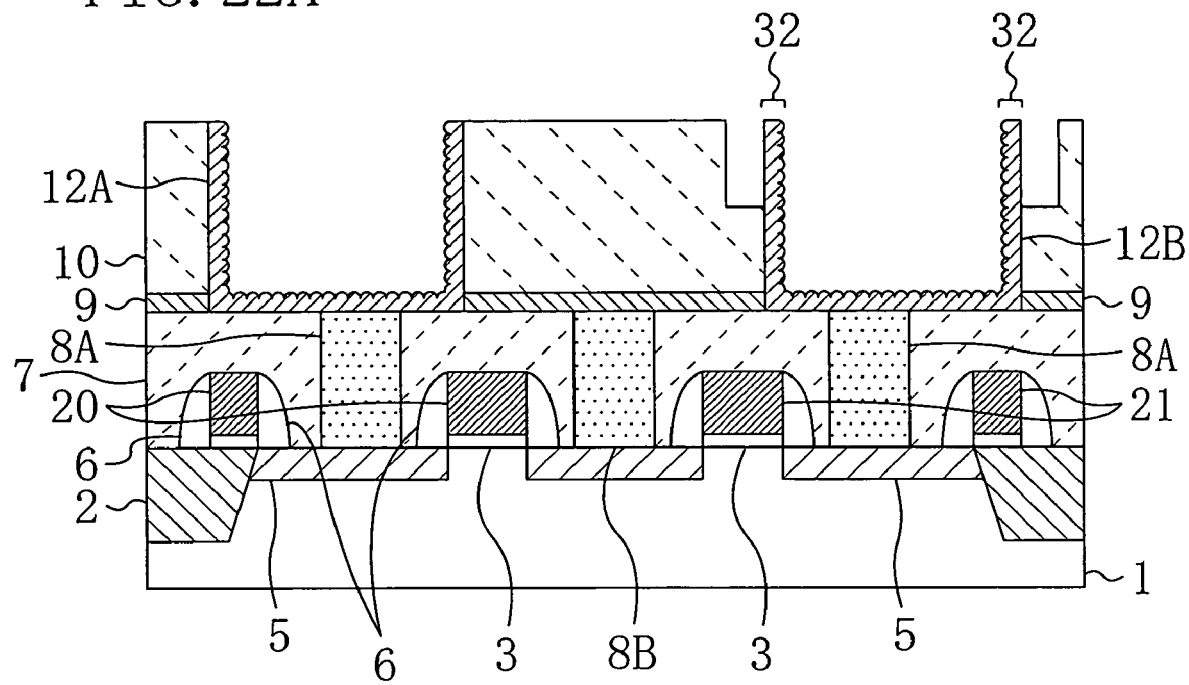
FIGS. 22A and 22B are cross-sectional views indicating process steps for fabricating the semiconductor memory device of the third embodiment of the present invention.
Figure 22B:
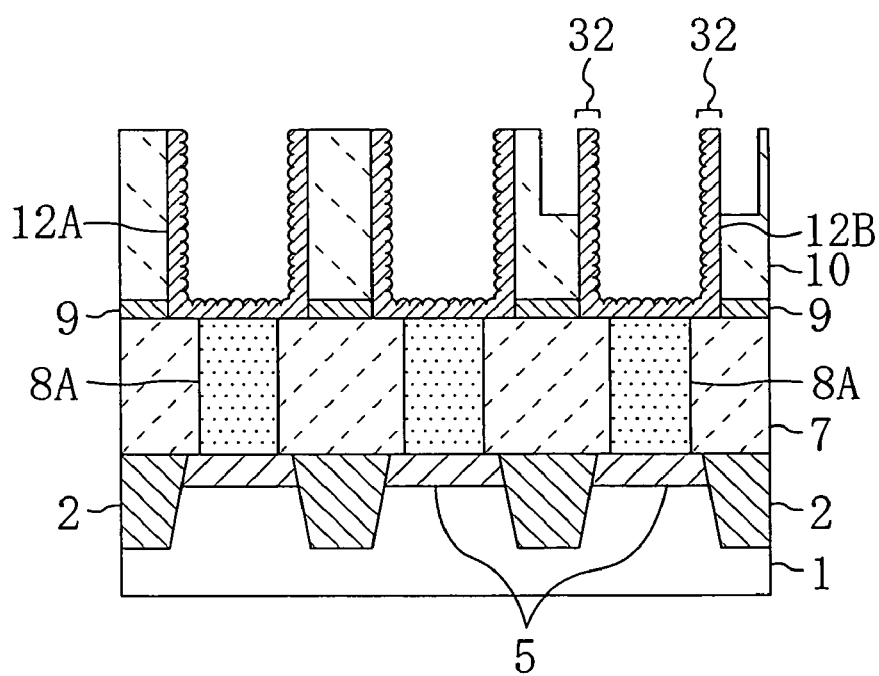

Next, with the resist pattern 31 used as a mask, the exposed portions of the second interlayer dielectric film 10 are selectively removed by dry etching as shown in FIGS. 22A and 22B, thereby forming projections 32 of the dummy lower electrodes 12B. The resist pattern 31 is then removed.

Figure 23A:
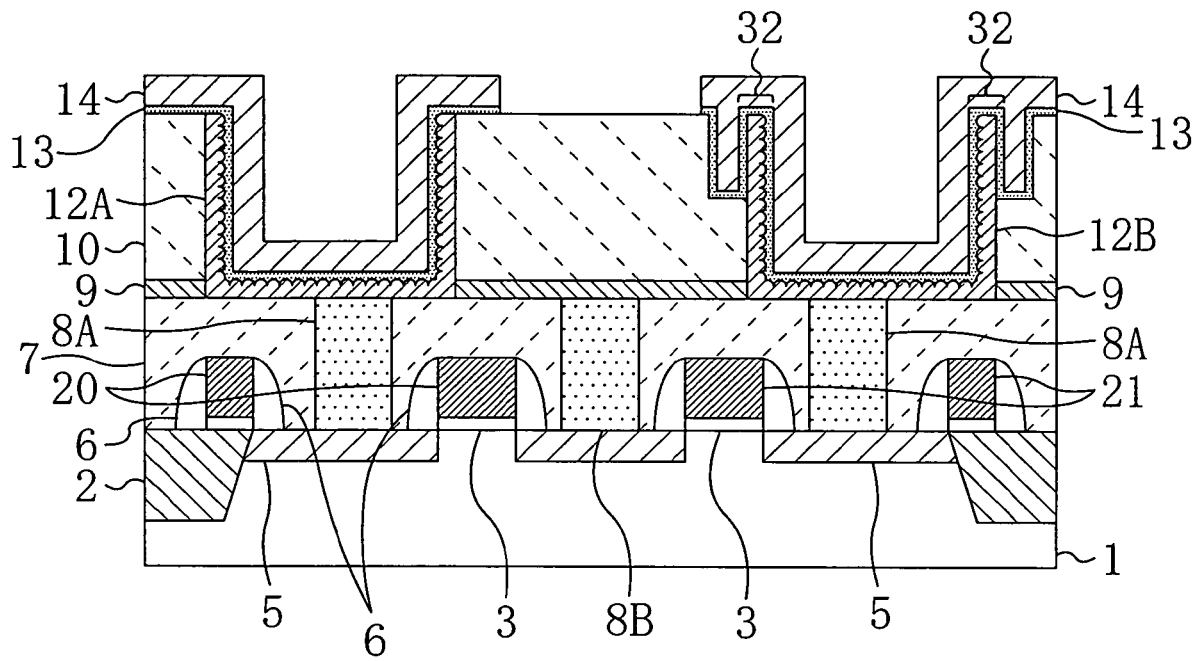
FIGS. 23A and 23B are cross-sectional views indicating process steps for fabricating the semiconductor memory device of the third embodiment of the present invention.
Figure 23B:
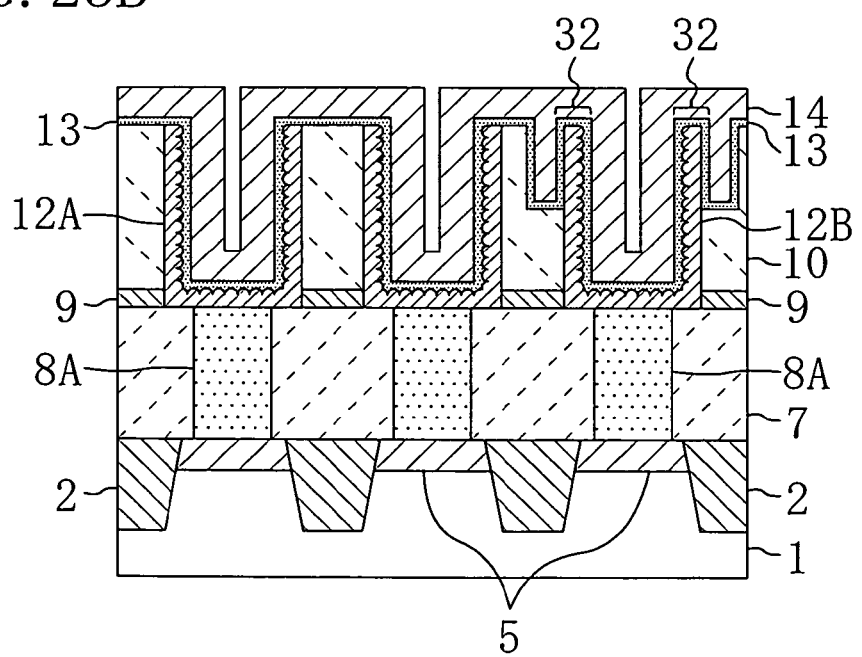

Subsequently, as shown in FIGS. 23A and 23B, a capacitive insulating film 13 having a thickness of 10 nm and made of $Ta_2O_5$, for example, and an upper electrode 14 having a thickness of 50 nm and made of TiN, for example, are formed in this order over the memory cell regions including the lower electrodes 12A and over the dummy cell regions including the dummy lower electrodes 12B. By this step, the memory cell capacitors, composed of the lower electrodes 12A, the capacitive insulating film 13, and the upper electrode 14, are formed, while the dummy cell capacitors, composed of the dummy lower electrodes 12B, the capacitive insulating film 13, and the upper electrode 14, are formed. Only the inner wall surface of each lower electrode 12A opposes the upper electrode 14 with the capacitive insulating film 13 interposed therebetween. On the other hand, the inner wall surface and part of the outer wall surface of each dummy lower electrode 12B oppose the upper electrode 14 with the capacitive insulating film 13 interposed therebetween.

Figure 24A:
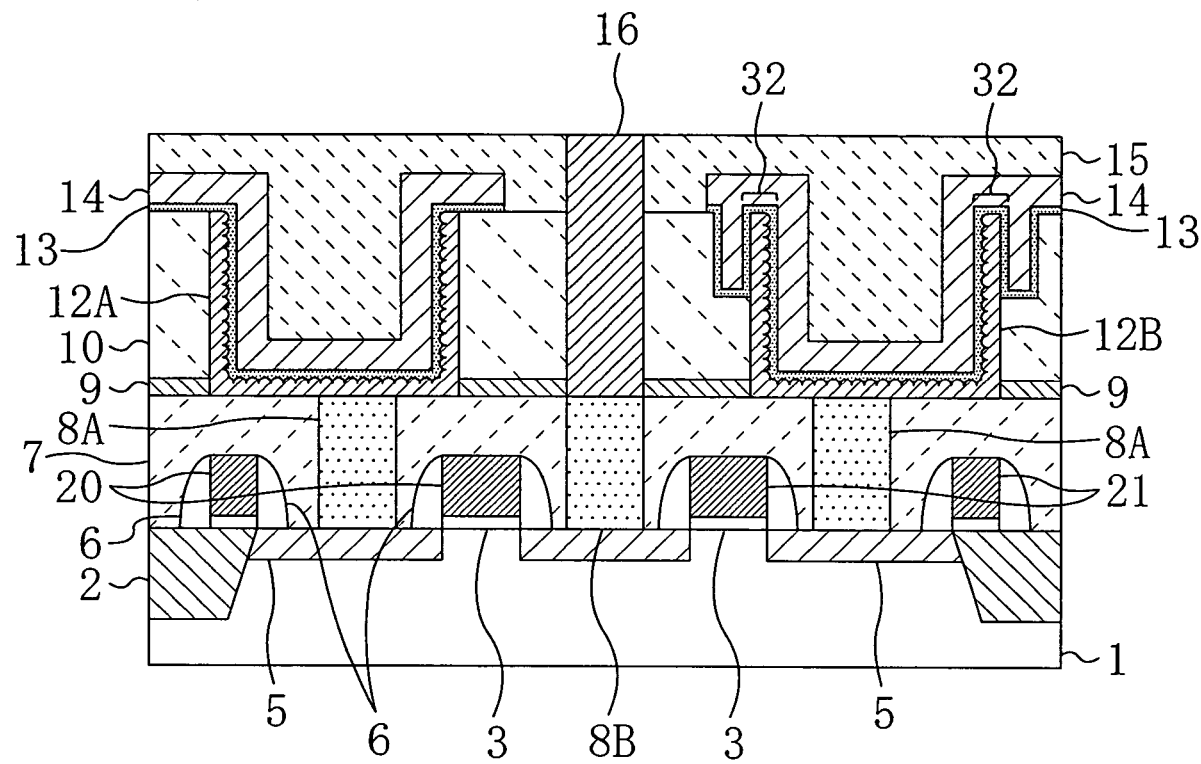
FIGS. 24A and 24B are cross-sectional views indicating process steps for fabricating the semiconductor memory device of the third embodiment of the present invention.
Figure 24B:
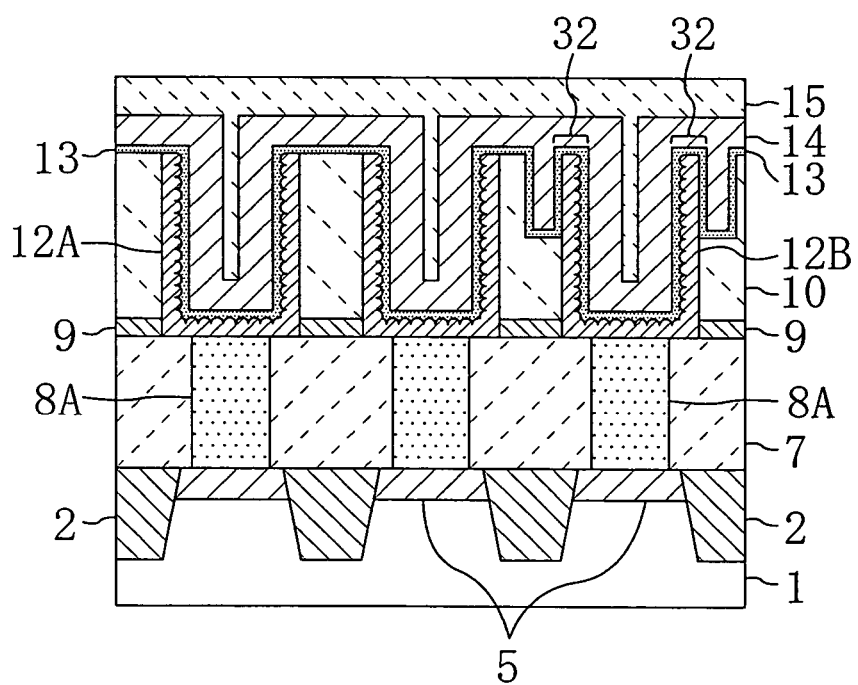

Then, as shown in FIGS. 24A and 24B, a third interlayer dielectric film 15 made of a NSG film, for example, is formed on the second interlayer dielectric film 10 as well as on the upper electrode 14, and the surface of the third interlayer dielectric film 15 is then planarized. Then, a bit line contact 16, which is connected to a plug 8B, is formed through the silicon nitride film 9, the second interlayer dielectric film 10, and the third interlayer dielectric film 15. In this step, although not shown, a contact that is connected to the upper electrode 14 is formed in the third interlayer dielectric film 15.

In this embodiment, a NSG film, formed by a method in which high-density plasma (HDP) typically having excellent space-filling characteristics is used, is employed as the third interlayer dielectric film 15. The electric charge, injected into the upper electrode 14 as a result of the plasma treatment performed when the NSG film is formed, passes preferentially through the capacitive insulating film 13 in the dummy cells to the dummy lower electrodes 12B, as described above. Therefore, in the memory cells, the capacitive insulating film 13 is prevented from deteriorating due to the plasma damage.

Subsequently, multilayer interconnection (including the bit lines (wires) 17 shown in FIGS. 20A and 20B and main word lines (metal wires formed above the bit lines 17 and connected to the word lines (the gate electrodes 20) through contacts) is formed using known techniques to complete the DARM of this embodiment.

As described above, in the third embodiment, the dummy lower electrodes 12B are formed with the projections 32, whereby leakage paths can be formed by utilizing electric field concentration produced in the projections 32. In other words, the charge-up damage caused in the process step performed after the formation of the memory cell capacitors can be absorbed into the dummy cells, which enables the formation of the highly reliable DRAM memory cells.

Moreover, in the third embodiment, the highly reliable DRAM memory cells can be formed just by adding the lithography and etching process steps for forming the projections 32 of the dummy lower electrodes 12B.

Also, it is apparent that the third embodiment may be applied to various types of memories other than DRAMs.

Furthermore, in the third embodiment, the transverse dimension of the dummy lower electrodes 12B may be made shorter than that of the lower electrodes 12A as in the first embodiment. Then, leakage current is more likely to pass through the dummy cell capacitors.

Also, in the third embodiment, the bottom of each dummy lower electrode 12B may be formed with a projection and a recess as in the second embodiment so that at least part of the bottom of the dummy lower electrode 12B is located lower than the upper surface of the corresponding plug 8A. Then, leakage current is more likely to pass through the dummy cell capacitors.

Fourth Embodiment

Hereinafter, a semiconductor memory device and a method for fabricating the same according to a fourth embodiment of the present invention will be described with reference to the accompanying drawings.

Figure 25A:
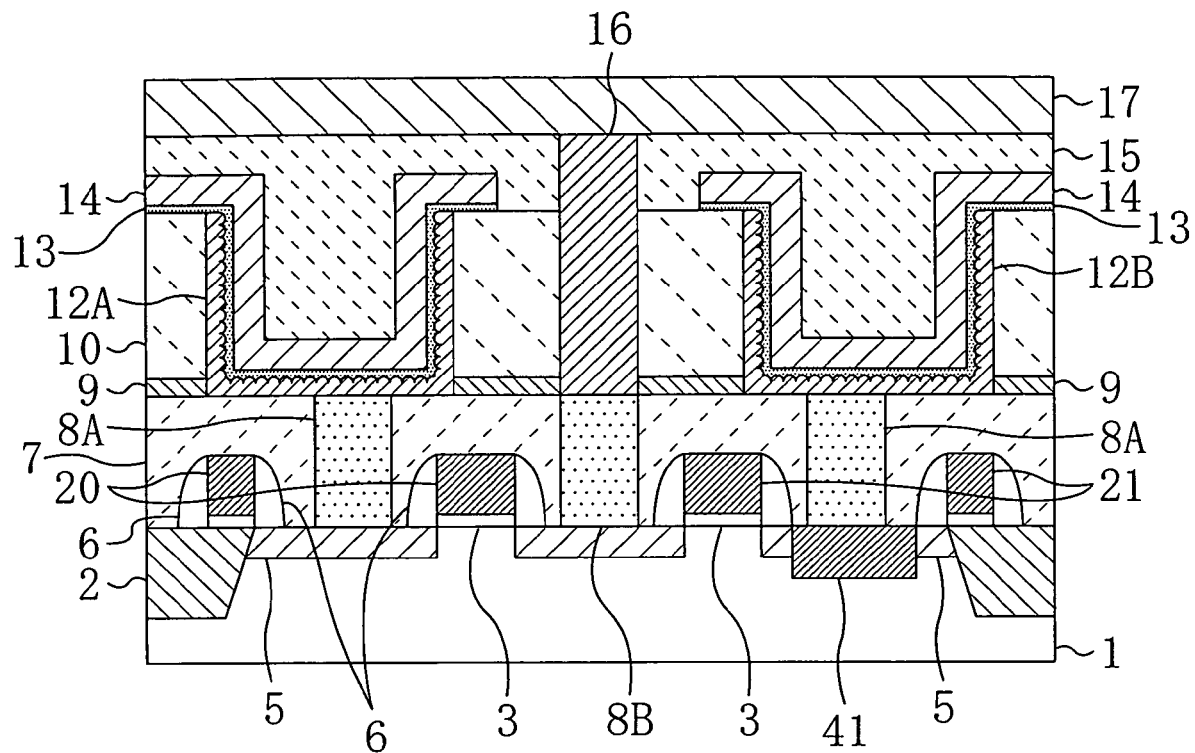
FIGS. 25A and 25B are cross-sectional views of a semiconductor memory device according to a fourth embodiment of the present invention.
Figure 25B:
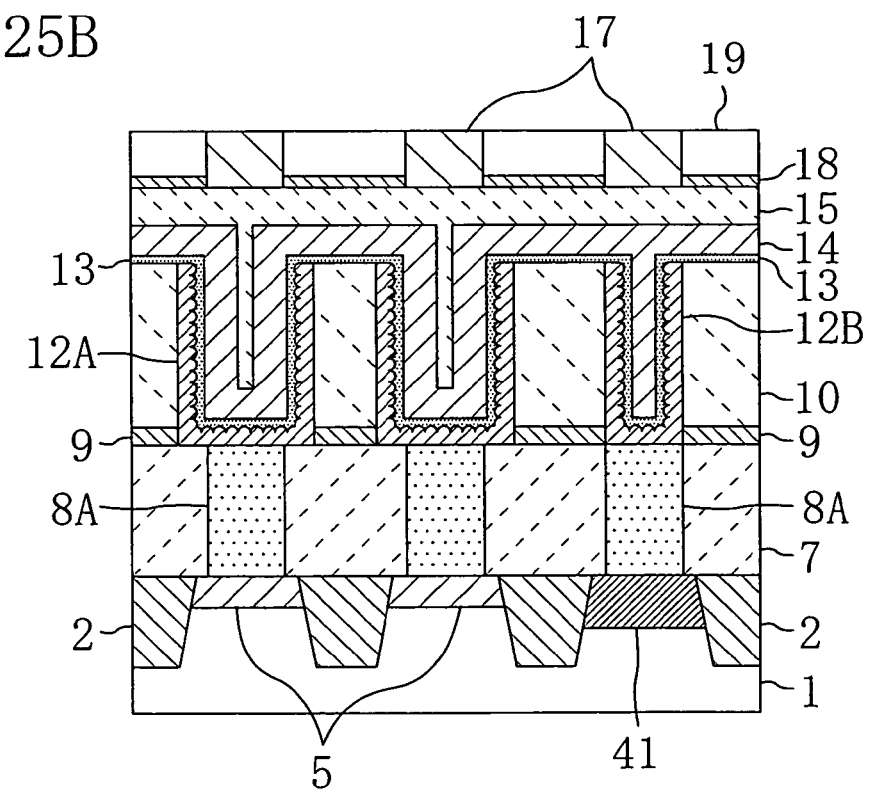

The plan configuration of the semiconductor memory device of the fourth embodiment is basically the same as that of the first embodiment shown in FIG. 1. FIGS. 25A and 25B are cross-sectional views of the semiconductor memory device of the fourth embodiment. FIG. 25A is the cross-sectional view taken along the line A-A' of FIG. 1, while FIG. 25B is the cross-sectional view taken along the line B-B' of FIG. 1. In FIGS. 25A and 25B, the same components as those of the first embodiment shown in FIG. 1 and FIGS. 2A and 2B are identified by the same reference numerals, and descriptions thereof are thus omitted herein.

The fourth embodiment differs from the first embodiment in the following respects. As shown in FIGS. 25A and 25B, in dummy cell regions, $N^+$-type doped layers 41, instead of N-type doped layers 5, are formed in the surface portion of a semiconductor substrate 1. The N-type dopant (impurity) concentration in the N+-type doped layers 41 is higher than that in the doped layers 5. In other words, in the dummy cell regions, PN junctions are formed between the semiconductor substrate 1 and the doped layers 41 having a higher dopant concentration than the doped layers 5, which form PN junctions with the semiconductor substrate 1 in memory cell regions. That is, the dopant concentration in the doped layers 41, which are electrically connected to dummy lower electrodes 12B through plugs 8A and serve as the source/drain regions of the dummy cell transistors, is higher than the dopant concentration in the doped layers 5, which are electrically connected to lower electrodes 12A through plugs 8A and serve as the source/drain regions of the memory cell transistors.

Therefore, leakage current is more likely to pass through the PN junctions formed in the dummy cell regions than through the PN junctions formed in the memory cell regions. In other words, the amount of leakage current produced per unit area of the dummy cell capacitors is larger than that produced per unit area of the memory cell capacitors. Therefore, even if plasma damage is caused in a process step performed after the formation of the memory cell capacitors, the electric charge (leakage current) produced by the plasma damage passes preferentially through the dummy cell capacitors to the doped layers 41. It is thus possible to avoid charge-up damage in the capacitive insulating film 13 in the memory cells.

In the fourth embodiment, the doped layers 5 have substantially the same dopant concentration as typical LDD regions, which is, e.g., about $2\times10^{18}$ atoms/cm$^3$, while the dopant concentration in the doped layers 41 is about $2\times10^{20}$ atoms/cm$^3$, for example.

Next, it will be described how to fabricate the semiconductor memory device of the fourth embodiment with reference to the accompanying figures.

Figure 26A:
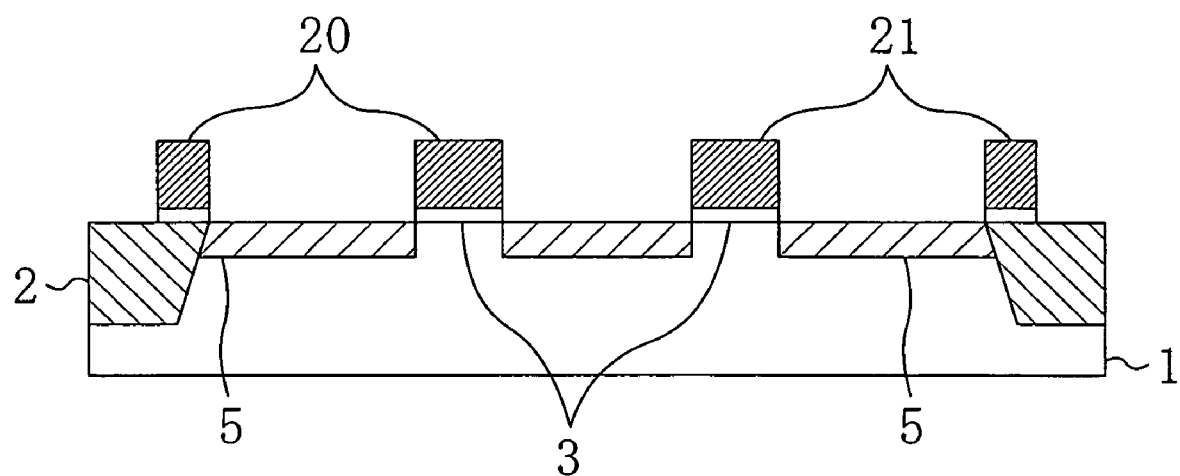
FIGS. 26A and 26B are cross-sectional views indicating process steps for fabricating the semiconductor memory device of the fourth embodiment of the present invention.
Figure 26B:
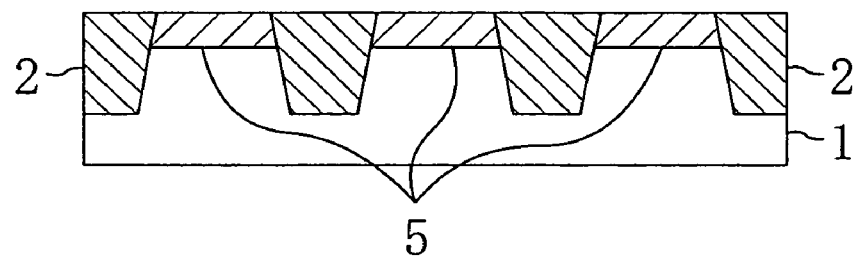
Figure 27A:
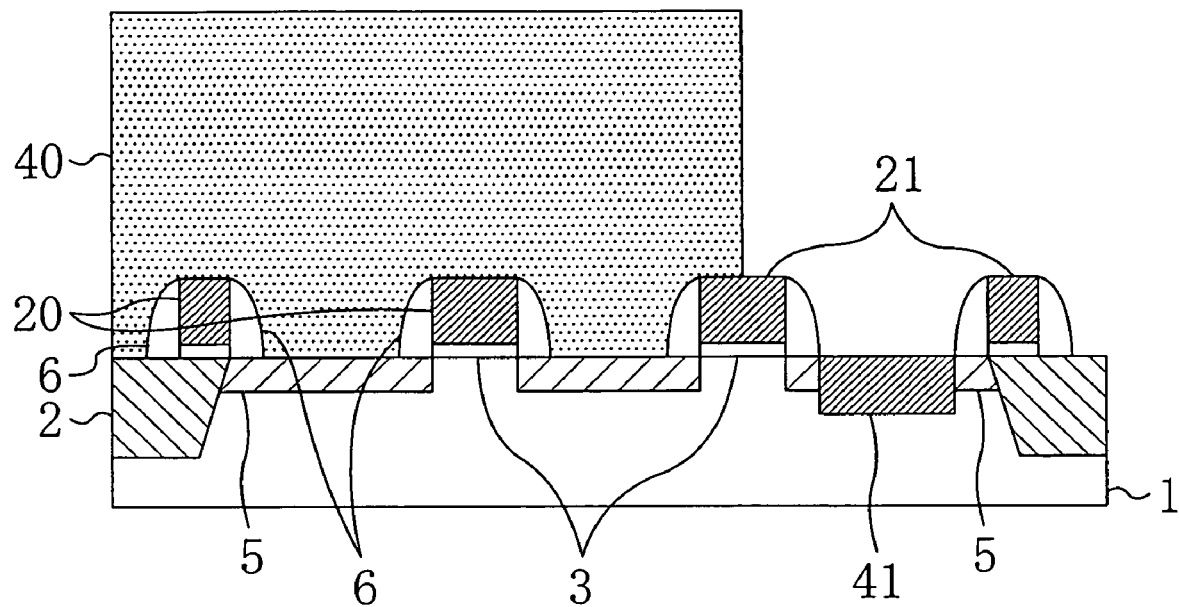
FIGS. 27A and 27B are cross-sectional views indicating process steps for fabricating the semiconductor memory device of the fourth embodiment of the present invention.

FIGS. 26A, 26B, 27A, and 27B are cross-sectional views indicating process steps for fabricating the semiconductor memory device of the fourth embodiment. FIGS. 26A and 27A correspond to the cross-sectional structure taken along the line A-A' of FIG. 1, while FIGS. 26B and 27B correspond to the cross-sectional structure taken along the line B-B' of FIG. 1.

As shown in FIGS. 26A and 26B, a device isolation region 2 is formed in a P-type semiconductor substrate 1, for example, in the same manner as described in the process steps of the first embodiment shown in FIGS. 4A and 4B. Then, although not shown, well implant, channel-stop implant, and dopant implant for threshold-value control are carried out in sequence so as to form N-channel transistors and P-channel transistors in a logic section and memory cell transistors. Thereafter, gate electrodes 20, serving as word lines, and dummy gate electrodes 21, serving as dummy word lines, are formed in memory cell regions and dummy cell regions, respectively, over the semiconductor substrate 1 with a gate insulating film 3 interposed between the substrate 1 and each electrode. Subsequently, P (phosphorus) ions, for example, are implanted into the semiconductor substrate 1 at an acceleration voltage of 10 keV and at a dose of $2\times10^{13}$ ions/cm$^2$, for example, with a resist pattern (not shown) used as a mask, wherein the resist pattern has openings corresponding at least to the memory cell regions and the dummy cell regions. By this ion implantation step, N-type doped layers 5 are formed. Although not shown, so-called LDD implant or extension implant is performed in the logic section.

Figure 27B:
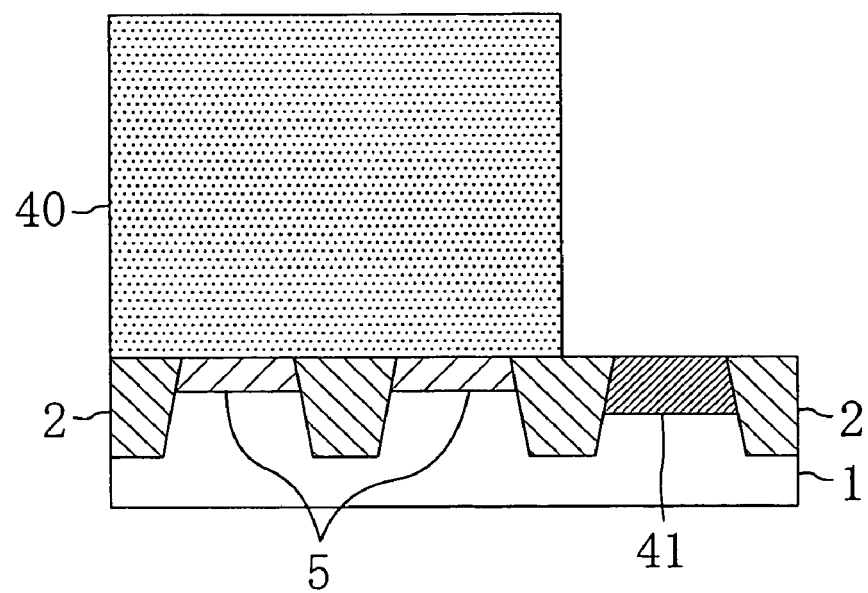
Figure 28:
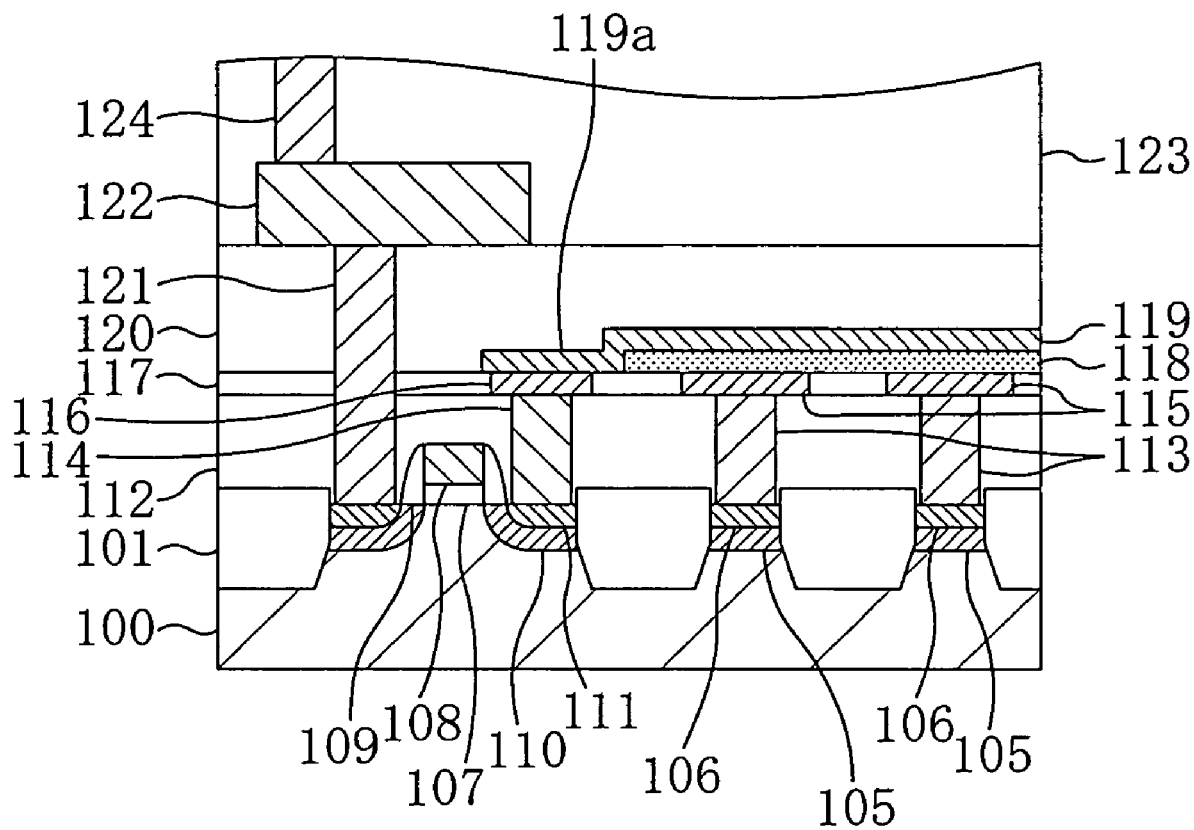
FIG. 28 is a cross-sectional view of a conventional semiconductor memory device.

Next, as shown in FIGS. 27A and 27B, As (arsenic) ions, for example, for forming the source/drain regions of the N-channel transistors in the logic section are implanted into the semiconductor substrate 1 at an acceleration voltage of 50 keV and at a dose of $5\times10^{15}$ ions/cm$^2$, for example, with a resist pattern 40 used as a mask, wherein the resist pattern 40 covers at least the memory cell regions and has openings corresponding at least to the dummy cell regions and the N-channel-transistor formation regions (not shown) in the logic section. By this ion implant, N+-type doped layers 41, having a higher N-type dopant concentration than the doped layers 5, are formed in the dummy cell regions.

The subsequent process steps are the same as those of the first embodiment shown in FIGS. 5A, 5B, 6A, 6B, 7A, 7B, 8A, and 8B.

As described above, in the fourth embodiment, the doped layers 41, having a higher dopant concentration than the doped layers 5 serving as the source/drain regions of the memory cell transistors, are formed as the source/drain regions of the dummy cell transistors. Therefore, electric charge injected into the dummy lower electrodes 12B due to plasma damage is more likely to pass through the semiconductor substrate 1. That is, charge-up damage caused in a process step performed after the formation of the memory cell capacitors can be absorbed into the dummy cells, which enables the formation of the highly reliable DRAM memory cells.

Also, in the fourth embodiment, the doped layers 41 are formed in the process step in which the ion implantation for forming the source/drain regions of the N-channel transistors in the logic section is performed. Therefore, the highly reliable DRAM memory cells can be formed just by adjusting the mask layout, without adding any new process steps.

Although the fourth embodiment is directed to the DRAM including the stacked capacitors, similar effects are also achievable when the inventive techniques of the fourth embodiment are applied to DRAMs that include trench capacitors. It is apparent that the inventive techniques of the fourth embodiment are also applicable to various types of memories other than DRAMs.

Moreover, in the fourth embodiment, the N-type heavily doped layers 41 are formed in the dummy cell regions in the semiconductor memory device and the fabrication method thereof according to the first embodiment. However, even if the N-type heavily doped layers 41 are formed in the dummy cell regions in the semiconductor memory device and the fabrication method thereof according to the second or third embodiment, effects similar to those obtained in this embodiment are also achievable.

Furthermore, in the fourth embodiment, the ion implantation step (see FIGS. 26A and 26B) for forming the doped layers 5 may be performed after the ion implantation step (see FIGS. 27A and 27B) for forming the doped layers 41. Also, in the ion implantation step for forming the doped layers 5, the ions do not have to be implanted into the part of the semiconductor substrate 1 located in the dummy cell regions. Moreover, the ion implantation for forming the doped layers 41 may be performed separately from the ion implantation for forming the source/drain regions of the N-channel transistors in the logic section. In addition, each doped layer 5 may be formed so that the portion thereof being in contact with the plug 8A has a higher dopant concentration than the other portion thereof.

What is claimed is:

1. A semiconductor memory device comprising:
   a memory cell including a first capacitor and a memory cell transistor, the first capacitor being composed of a first lower electrode, a first capacitive insulating film and a first upper electrode, and the memory cell transistor including a first gate electrode and a first doped layer; and a dummy cell including a second capacitor and a dummy cell transistor, the second capacitor being composed of a second lower electrode, a second capacitive insulating film and a second upper electrode, and the dummy cell transistor including a second gate electrode and a second doped layer, wherein the first upper electrode and the second upper electrode are formed from a same conductive film, the first lower electrode is electrically connected to the first doped layer via a first contact plug directly connected to the first lower electrode, the second lower electrode is electrically connected to the second doped layer via a second contact plug directly connected to the second lower electrode, and the transverse dimension of the bottom of the second lower electrode being rectangular in planer shape is shorter than the transverse dimension of the bottom of the first lower electrode being rectangular in planer shape.

2. The device of claim 1, wherein the first capacitor and the second capacitor are both stacked capacitors; and the bottom of the second lower electrode is uneven so that at least part of the bottom of the second lower electrode is located lower than the upper surface of the second contact plug.

3. The device of claim 1, wherein the first capacitor and the second capacitor are both stacked capacitors;

the first lower electrode has a hollow cylindrical shape, and only an inner-wall surface of the first lower electrode opposes the first upper electrode with the first capacitive insulating film interposed therebetween; and the second lower electrode has a hollow cylindrical shape, and an inner-wall surface and part of an outer-wall surface of the second lower electrode oppose the second upper electrode with the second capacitive insulating film interposed between the inner wall surface and the second upper electrode and between the part of the outer-wall surface and the second upper electrode.

4. The device of claim 1, wherein the first doped layer has a lower dopant concentration than the second doped layer.

5. The device of claim 1, wherein the first doped layer has a lower dopant concentration than the second doped layer.

6. The device of claim 1, wherein
the memory cell comprises a memory cell array, and
the dummy cell is formed in a peripheral portion of the memory cell array.

7. The device of claim 1, wherein the first capacitive insulating film and the second capacitive insulating film are formed from a same insulating film.

8. The device of claim 1, wherein the first capacitor and the second capacitor are both stacked capacitors.

9. The device of claim 1, wherein the first contact plug and the second contact plug are made of polysilicon.

10. The device of claim 1, wherein the first lower electrode and the second lower electrode are made of HSG (hemispherical grained) polysilicon.

11. The device of claim 1, wherein the first capacitive insulating film and the second capacitive insulating film are made of $Ta_2O_5$.

12. The device of claim 1, wherein the first upper electrode and the second upper electrode are made of TiN.

13. The device of claim 1, wherein the dummy cell is not accessed through the word lines, and does not function as memory.

14. The device of claim 1, wherein an interlayer dielectric film is formed on the first upper electrode and the second upper electrode by a method in which high-density plasma is used.

15. The device of claim 14, wherein the interlayer dielectric film is a NSG (non-doped silicate glass) film.

16. The device of claim 1, wherein bit lines are formed over the first upper electrode and the second upper electrode with interlayer dielectric films interposed therebetween.

\* \* \* \* \*